US012790203B2

(12) United States Patent
Wu et al.

(10) Patent No.: US 12,790,203 B2
(45) Date of Patent: Nov. 10, 2026

(54) MICROMIRROR CHIP PACKAGE STRUCTURE, LASER DEVICE, AND VEHICLE

(71) Applicant: HUAWEI TECHNOLOGIES CO., LTD., Shenzhen (CN)

(72) Inventors: Jiahao Wu, Shenzhen (CN); Li Zeng, Shenzhen (CN); Wu Zhou, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 432 days.

(21) Appl. No.: 18/599,907

(22) Filed: Mar. 8, 2024

(65) Prior Publication Data

US 2024/0208803 A1 Jun. 27, 2024

Related U.S. Application Data

(63) Continuation of application No. PCT/CN2022/117939, filed on Sep. 8, 2022.

(30) Foreign Application Priority Data

Sep. 10, 2021 (CN) ........................ 202111063339.2

(51) Int. Cl.
*B81B 7/00* (2006.01)
*B81B 7/02* (2006.01)
*G02B 26/08* (2006.01)

(52) U.S. Cl.
CPC .............. *B81B 7/0016* (2013.01); *B81B 7/02* (2013.01); *G02B 26/0833* (2013.01)

(58) Field of Classification Search
CPC ................ B81B 7/0016; G02B 26/105; G02B 26/101; G02B 26/085; G02B 26/0833; G02B 26/08
See application file for complete search history.

(56) References Cited

U.S. PATENT DOCUMENTS

| | | | | |
|---|---|---|---|---|
| 10,551,613 B2 * | 2/2020 | Zhou | .................... | G02B 26/085 |
| 2012/0099176 A1 * | 4/2012 | Zhou | .................. | G02B 26/0841 359/290 |

(Continued)

FOREIGN PATENT DOCUMENTS

| | | | |
|---|---|---|---|
| CN | 103244599 B | 1/2015 | |
| CN | 108609576 B | 12/2019 | |
| DE | 102018220422 A1 * | 5/2020 | ............ G02B 7/182 |

OTHER PUBLICATIONS

Bond, "MEMS and Additively Manufactured Micro-Mechanical Isolators," Thesis for the Degree of Master of Science, UAuburn University, Aug. 8, 2020, 74 pages.

*Primary Examiner* — Evren Seven
(74) *Attorney, Agent, or Firm* — Fish & Richardson P.C.

(57) ABSTRACT

Embodiments of this application provide a micromirror chip package structure. The micromirror chip package structure includes a micromirror chip, and a first substrate and a second substrate that are stacked, where the micromirror chip is disposed on a side that is of the first substrate and that faces away from the second substrate, where the micromirror chip includes a frame, a movable component, and a first torsion arm, and the movable component is connected to the frame through the first torsion arm; the first substrate includes a vibration isolation platform, an elastic beam, and a support frame, the micromirror chip is disposed on the vibration isolation platform, and the vibration isolation platform is connected to the support frame through the elastic beam; the support frame is fastened to the second substrate, and a gap is formed between the vibration isolation platform and the second substrate.

20 Claims, 18 Drawing Sheets

(56) References Cited

U.S. PATENT DOCUMENTS

| | | | | |
|---|---|---|---|---|
| 2012/0120470 | A1* | 5/2012 | Kitazawa | B81B 3/0045 359/221.3 |
| 2018/0230005 | A1 | 8/2018 | Lee et al. | |
| 2019/0146210 | A1* | 5/2019 | Maier | B81B 3/00 359/200.8 |
| 2023/0174370 | A1* | 6/2023 | Sun | B81B 3/001 359/221.3 |

* cited by examiner

MICROMIRROR CHIP PACKAGE STRUCTURE, LASER DEVICE, AND VEHICLE

CROSS-REFERENCE TO RELATED APPLICATIONS

This application is a continuation of International Application No. PCT/CN2022/117939, filed on Sep. 8, 2022, which claims priority to Chinese Patent Application No. 202111063339.2, filed on Sep. 10, 2021. The disclosures of the aforementioned applications are hereby incorporated by reference in their entireties.

TECHNICAL FIELD

Embodiments of this application relate to the field of micro-electro-mechanical system technologies, and in particular, to a micromirror chip package structure, a laser device including the micromirror chip package structure, and a vehicle having the laser device.

BACKGROUND

A micro-electro-mechanical system (micro-electro-mechanical system, MEMS) micromirror may implement one-dimensional or two-dimensional beam scanning through torsion. In addition, the MEMS micromirror is a beam scanning manner based on a mature semiconductor processing technology, which can implement miniaturization and integration. Because of features such as low costs, low energy consumption, high precision, a large rotation angle, and high reliability, the MEMS micromirror is widely applied to the fields such as 3D scanning, laser display, and a lidar.

FIG. 1*a* shows an MEMS micromirror chip structure that can implement two-dimensional beam scanning. The MEMS micromirror chip structure mainly includes a frame 101, a drive coil 1021, a micromirror 1023, a first torsion arm 103, and a second torsion arm 1022. The drive coil 1021 is connected to the frame 101 through the first torsion arm 103 that extends in an X direction in the figure, and the micromirror 1023 is connected to the drive coil 1021 through the second torsion arm 1022 that extends in a Y direction in the figure. In this way, under the action of Lorentz force, the drive coil 1021 may drive the micromirror 1023 to rotate around the first torsion arm 103 and the second torsion arm 1022 that are perpendicular to each other, to implement the two-dimensional beam scanning.

In some usage scenarios, for example, when being used in a lidar, the MEMS micromirror chip in FIG. 1*a* may be disposed on a vehicle body. During vehicle driving, the vehicle body is prone to vibration; affected by the vibration of the vehicle body, as shown in FIG. 1*b*, the drive coil 1021 and the micromirror 1023 are greatly displaced relative to the frame 101 in a Z direction; and stress on the first torsion arm 103 may be far higher than material yield stress. Further, the first torsion arm 103 is prone to breakage and damage under the stress, which affects use performance of the MEMS micromirror chip.

SUMMARY

This application provides a micromirror chip package structure, a laser device including the micromirror chip package structure, and a vehicle having the laser device, to provide a micromirror chip package structure that can suppress a vibration amplitude of a micromirror chip.

To achieve the foregoing objective, the following technical solutions are used in embodiments of this application.

According to a first aspect, this application provides a micromirror chip package structure, and the micromirror chip package structure may be used in a lidar device.

The micromirror chip package structure includes a micromirror chip (which may also be referred to as an MEMS micromirror chip), and a first substrate and a second substrate that are stacked, where the micromirror chip is disposed on a side that is of the first substrate and that faces away from the second substrate, where the micromirror chip includes a frame, a movable component, and a first torsion arm, and the movable component is connected to the frame through the first torsion arm; the first substrate includes a vibration isolation platform, an elastic beam, and a support frame, the micromirror chip is disposed on the vibration isolation platform, and the vibration isolation platform is connected to the support frame through the elastic beam; the support frame is fastened to the second substrate, and a gap is formed between the vibration isolation platform and the second substrate; and the vibration isolation platform and the second substrate each have a hollow area, and the hollow area is opposite to the movable component to accommodate the movable component.

Based on the foregoing description of the micromirror chip package structure provided in this application, it can be learned that the frame, the movable component, and the first torsion arm in the micromirror chip form a single-degree-of-freedom system. The micromirror chip package structure further includes the vibration isolation platform, the support frame, and the elastic beam for connecting the vibration isolation platform and the support frame, that is, the vibration isolation platform carrying the micromirror chip, the elastic beam, and the support frame form another single-degree-of-freedom system. Therefore, the micromirror chip package structure provided in this application is a two-degree-of-freedom system. When the micromirror chip package structure is interfered by external vibration, the first torsion arm can absorb a part of vibration energy transferred to the movable component, and the elastic beam can further attenuate the vibration energy transferred to the movable component, thereby reducing a vibration amplitude of the movable component and reducing a possibility that the movable component is damaged.

In addition, because there is the gap between the vibration isolation platform and the second substrate, the vibration isolation platform carrying the micromirror chip generates large squeeze-film damping in a movement process, to suppress a vibration amplitude of the vibration isolation platform and further reduce a vibration amount of the movable component.

In addition, the hollow area is arranged in positions that are of the vibration isolation platform and the second substrate and that are opposite to the movable component, and the hollow area can provide space for the movable component that is moving and can cause the movable component to generate damping in the moving process, to reduce the vibration amplitude of the movable component.

In a possible implementation of the first aspect, the gap is filled with a damping medium.

In other words, the filled damping medium can further dissipate moving energy of the movable component, thereby further reducing a vibration amplitude of the movable component.

In a possible implementation of the first aspect, the damping medium includes a liquid damping medium and/or a solid damping medium. For example, the gap is filled with only the liquid damping medium, for example, which may be grease. For another example, the gap is filled with the solid damping medium, for example, which may be at least one of vibration isolation and energy absorption materials such as rubber, an anisotropic conductive film (anisotropic conductive film, ACF) vibration absorption material, silica gel, a Parylene (Parylene) vacuum coating, and plastic. For another example, the gap is filled with not only the liquid damping medium, but also the solid damping medium.

The liquid medium or the solid medium having vibration isolation and energy absorption functions is filled in the gap, so that a damping ratio of the package structure can be further improved, and vibration isolation effect can be improved.

In a possible implementation of the first aspect, a groove is formed on surfaces that are of the vibration isolation platform and the elastic beam and that face the second substrate, and the groove forms the gap.

In other words, in an implementable process, the groove may be disposed on a surface that is of the first substrate and that faces the second substrate, so that there is a damping gap that can absorb energy between the vibration isolation platform and the second substrate. In this design, a thickness of the vibration isolation platform can be reduced, an elastic modulus of the vibration isolation platform can be improved, vibration energy absorbed by the first substrate can be further increased, and a vibration amount of the movable component can be further reduced. Further, from a process perspective, for example, when the second substrate is made of glass and the first substrate is made of a semiconductor material, compared with disposing of the groove on the glass substrate, disposing of the groove on the semiconductor substrate is easier in process implementation. In addition, it is easier to control a size of the groove, to meet a designed damping coefficient.

In a possible implementation of the first aspect, the elastic beam is symmetrically disposed at a periphery of the vibration isolation platform relative to the micromirror chip.

Compared with asymmetric disposing, symmetric arrangement of the elastic beam relative to the micromirror chip can avoid generation of a mode that is more likely to cause the first torsion arm to break. Therefore, another disorderly mode is not introduced by symmetrically arranging the elastic beam relative to the micromirror chip.

In a possible implementation of the first aspect, a first electrode exists on a surface that is of the frame and that faces away from the first substrate, a second electrode exists on a surface that is of the vibration isolation platform and that faces the micromirror chip, and the first electrode and the second electrode are electrically connected through a lead.

The first electrode herein may be connected to the movable component, for example, may be electrically connected to a drive coil in the movable component, and is configured to: transmit a drive signal to the drive coil and transmit a feedback signal of the drive coil outwards.

Since the first electrode is disposed on the frame and the second electrode electrically connected to the first electrode is disposed on the vibration isolation platform fastened to the frame, vibration directions of the vibration isolation platform and the frame are basically the same in a specific use process. Even if the first electrode and the second electrode are electrically connected through the lead formed by using a wire-bonding (wire-bonding) process, the lead basically does not break due to vibration for a plurality of times. This improves use performance of the lead.

In a possible implementation of the first aspect, a third electrode exists on a surface that is of the support frame and that faces the micromirror chip, a first metal cable is further formed on the first substrate, the first metal cable is arranged along the elastic beam, and the second electrode and the third electrode are electrically connected through the first metal cable.

The third electrode herein may be electrically connected to an electronic component outside the micromirror chip package structure. Further, the movable component is electrically connected to the externally disposed electronic component through the first electrode, the lead, the second electrode, the first metal cable, and the third electrode.

In this embodiment, the first metal cable that is used to electrically connect the second electrode and the third electrode is arranged along the elastic beam. In this case, vibration isolation effect of the elastic beam is not affected, and an implementation process is simple, to implement signal transmission between the second electrode and the third electrode.

In a possible implementation of the first aspect, at least one sensor is disposed on the elastic beam, and the sensor is configured to detect a deformation amount of the elastic beam; and a fourth electrode exists on a surface that is of the first substrate and that faces the micromirror chip, a second metal cable is further formed on the first substrate, and the sensor and the fourth electrode are electrically connected through the second metal cable.

In a working process of the micromirror chip package structure, the elastic beam generates large stress due to elastic deformation. Therefore, the sensor for detecting the deformation amount of the elastic beam is disposed on the elastic beam, and is electrically connected to, through the second metal cable and the fourth electrode, a controller disposed in the micromirror chip package structure, to monitor a magnitude of vibration applied to the micromirror chip package structure, or to monitor a structural state of the elastic beam, that is, whether the elastic beam is in a damaged state or in an intact state.

In a possible implementation of the first aspect, there are a plurality of sensors, and the plurality of sensors are symmetrically disposed on the elastic beam relative to the micromirror chip.

If there are a plurality of sensors, the plurality of sensors may be symmetrically arranged along the elastic beam, to detect deformation amounts of a plurality of areas that are prone to damage.

In a possible implementation of the first aspect, the micromirror chip and the first substrate are of structures independent of each other, and the micromirror chip is disposed on the vibration isolation platform by using a connection structure.

In other words, the micromirror chip and the first substrate are two structural components. Further, when the micromirror chip package structure is packaged, the micromirror chip may be disposed on the vibration isolation platform by using an adhesive layer or a bonding structure.

In a possible implementation of the first aspect, the first electrode exists on the surface that is of the frame and that faces away from the first substrate, the second electrode exists on the surface that is of the vibration isolation platform and that faces the micromirror chip, and the first electrode and the second electrode are connected through the lead; and a support hole is disposed in a position that is of the second substrate and that is opposite to the lead, the support hole passes through the second substrate in a stacking direction of the first substrate and the second substrate, and the support hole is used for a support platform to pass through, so that the support platform supports parts that are of the frame and the vibration isolation platform and that are used to dispose the lead.

When the micromirror chip and the first substrate are of structures independent of each other, the first electrode and the second electrode need to be electrically connected by using a wire-bonding process, and because both the micromirror chip and the first substrate are thin, if the wire bonding is directly performed, the micromirror chip or the first substrate may be warped, or even the micromirror chip or the first substrate may be damaged. Therefore, because the support hole is provided in this application, the support platform may pass through the support hole during the wire bonding, to support parts that are of the micromirror chip and the first substrate and on which the wire bonding is performed. This can suppress warpage and deformation degrees. After the wire-bonding process is completed, the support platform can be removed.

In a possible implementation of the first aspect, an alignment mark exists on the surface that is of the vibration isolation platform and that faces the micromirror chip, and the alignment mark is used to position the micromirror chip, so that the micromirror chip is disposed in a central area of the first substrate.

In other words, when the micromirror chip is packaged, the micromirror chip may be positioned based on the alignment mark, so that the micromirror chip is fastened to a designed position. In this way, the micromirror chip is disposed in the central area of the first substrate. If the micromirror chip deviates from the central area, a mode that causes the first torsion arm to break may be generated.

In a possible implementation of the first aspect, the alignment mark may be formed by using a process like etching, electroplating, or the like.

In a possible implementation of the first aspect, the micromirror chip and the first substrate are of an integrally formed structure.

From a process perspective, not only the micromirror chip is formed on the substrate, but also structures such as the elastic beam, the support frame, and the vibration isolation platform are formed. In this way, a quantity of structural components can be reduced, integration can be improved, and manufacturing costs can be reduced.

In a possible implementation of the first aspect, the support frame is connected to the second substrate by using a bonding structure.

The support frame and the second substrate are connected by using the bonding process, so that a size of the gap between the vibration isolation platform and the second substrate can be accurately controlled, the formed gap meets a design requirement, and an elastic coefficient of the two-degree-of-freedom system meets the design requirement.

In a possible implementation of the first aspect, a size of the gap in the stacking direction of the first substrate and the second substrate is 10 μm to 30 μm. For example, the size of the gap may be 10 μm to 20 μm. For another example, the size of the gap may be 15 μm to 30 μm.

In a possible implementation of the first aspect, the first substrate includes a glass substrate, a ceramic substrate, or a semiconductor substrate; and the second substrate includes a glass substrate, a ceramic substrate, or a semiconductor substrate.

Materials of the first substrate and the second substrate herein may be the same or different.

In a possible implementation of the first aspect, the movable component includes a micromirror and a drive coil, the micromirror is connected to the drive coil through a second torsion arm, and the drive coil is connected to the frame through the first torsion arm; and the first torsion arm and the second torsion arm are perpendicular to each other, and are separately perpendicular to the stacking direction.

In other words, when the movable component includes the micromirror, the drive coil, and the second torsion arm, the formed micromirror chip can implement two-dimensional beam scanning.

In a possible implementation of the first aspect, the micromirror herein may be at least one of a magnetoelectric micromirror, an electrostatic micromirror, or a piezoelectric micromirror.

According to a second aspect, this application provides a laser device. The laser device includes a circuit board and the micromirror chip package structure according to any one of the possible implementations of the first aspect, and the circuit board is electrically connected to the micromirror chip in the micromirror chip package structure. The laser device provided in this application includes the micromirror chip package structure according to the first aspect. Therefore, on the basis of laser scanning implemented by the laser device, when vibration is applied to the laser device from the outside, a vibration amplitude of the movable component can be reduced, a possibility that the movable component is damaged can be reduced, and use performance of the laser device can be improved because the micromirror chip package structure is a two-degree-of-freedom system, the first torsion arm can absorb a part of vibration energy, and the elastic beam can further attenuate the vibration energy. In a possible implementation of the second aspect, the laser device further includes a laser, and the micromirror chip package structure is configured to reflect laser light emitted by the laser.

According to a third aspect, this application provides a vehicle. The vehicle includes a vehicle body and the laser device according to any one of the possible implementations of the second aspect, and the laser device is disposed on the vehicle body.

The vehicle provided in the embodiment of the third aspect of this application includes the laser device in the embodiment of the second aspect. Therefore, the vehicle provided in this embodiment of this application and the laser device in the foregoing technical solution can resolve a same technical problem and achieve same expected effect.

REFERENCE NUMERALS

10 and 001: Micromirror chip;
101: Frame; 102: Movable component; 103: First torsion arm; 104: First electrode;
1021: Drive coil; 1022: Second torsion arm; 1023: Micromirror;
20: Vibration isolation substrate;
201: First substrate and insulation silicon wafer;
2011: Vibration isolation platform; 2012, 20121, and 20122: Elastic beam; 2013: Support frame; 2014: Second electrode; 2015: Third electrode; 2016: First metal cable; 2017: Sensor; 2018: Fourth electrode; 2019: Second metal cable;
202: Second substrate;
201*a*: First hollow area;
202*a*: Second hollow area;
202*b*: Support hole;
30: Lead;
301: Liquid damping medium;
302: Solid damping medium;
40: Hollow area;
50: Alignment mark;
61: Photoresist layer;
62: Groove;
63: Metal layer;
002: Laser;
003: Collimator;
004: Target object;
005: Lens; and
006: Receiver.

DESCRIPTION OF EMBODIMENTS

Before embodiments of this application are described, related technical terms in this application are described first.

Mode: is a natural vibration characteristic of a structural system. Free vibration of a linear system is decoupled to N (N is a positive integer greater than or equal to 1) orthogonal single-degree-of-freedom vibration systems corresponding to N modes of the system. Each mode has a specific natural frequency, damping ratio, and mode of vibration.

The following describes each of the following embodiments of this application with reference to accompanying drawings in embodiments of this application.

Intelligent systems such as an autonomous vehicle, an intelligent robot, a virtual reality (virtual reality, VR) device, and augmented reality (augmented reality, AR) may all include a laser device. For example, if the laser device is disposed on the autonomous vehicle, the laser device can provide a complete 360-degree panoramic view, and visualize a surrounding environment of the vehicle in a laser pulse form.

Figure 2:
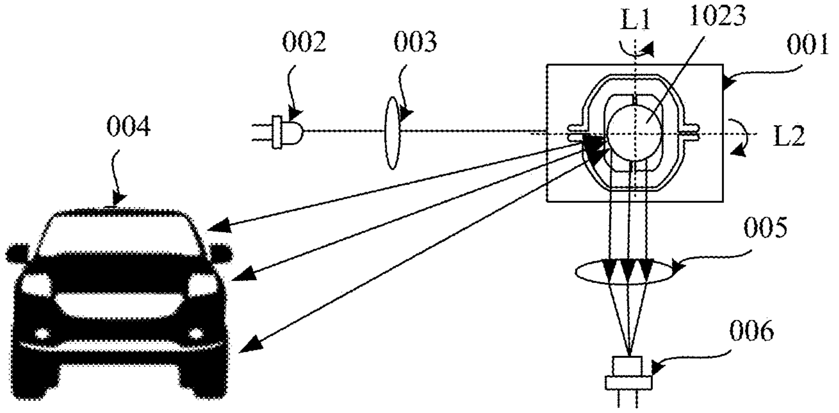
FIG. 2 is a diagram of a structure of a laser device.

FIG. 2 is a schematic diagram of a structure of a laser device. As shown in FIG. 2, the laser device includes a laser 002 and a micromirror chip 001. A pulse optical signal sent by the laser 002 is collimated and shaped by a collimator 003, and is irradiated to a micromirror 1023 of the micromirror chip 001. The micromirror 1023 rotates rapidly to scan and transmit the optical signal to a surrounding target object 004. After being reflected by the target object 004, scanned light is converged by a lens 005, and then received by a receiver 006, to complete detection of a surrounding environment.

Figure 1A:
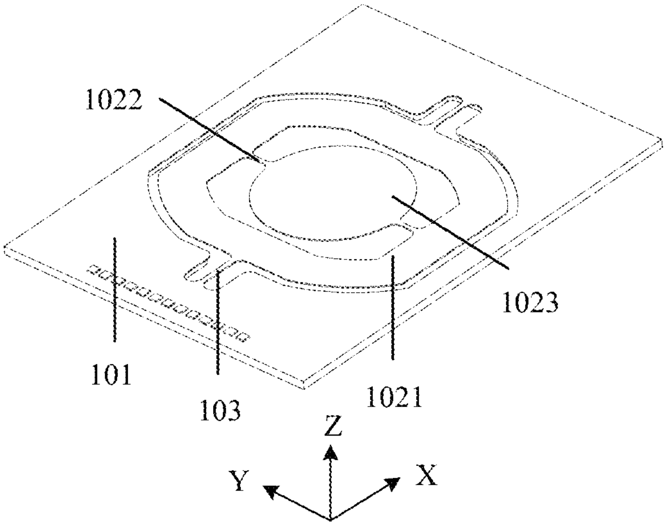
FIG. 1*a* is a diagram of a structure of a micromirror chip according to the conventional technology.
Figure 1B:
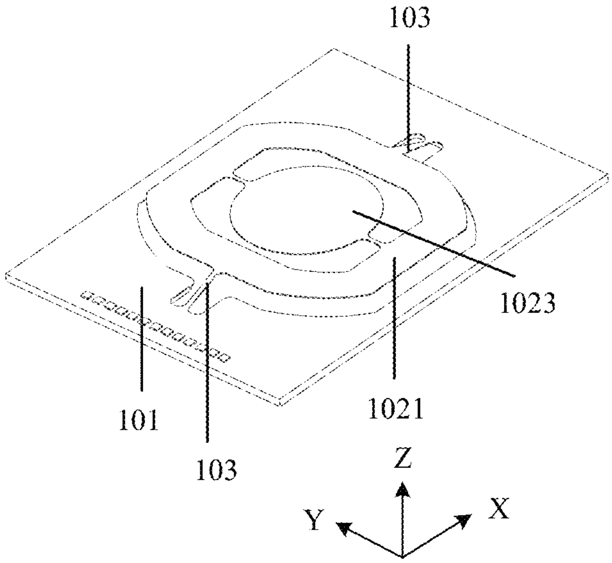
FIG. 1*b* is a diagram of a structure of a micromirror chip in a vibration mode according to the conventional technology.

In the laser device shown in FIG. 2, the micromirror 1023 can implement two-dimensional beam scanning. Specifically, as shown in FIG. 2, the micromirror 1023 may rotate around a straight line L1, and may further rotate around a straight line L2 perpendicular to the straight line L1, to implement the two-dimensional scanning. A structure of the micromirror chip 001 shown in FIG. 2 may be explained in detail with reference to FIG. 1*a* and FIG. 1*b*. In other words, the micromirror 1023 is connected to the drive coil 1021 through the second torsion arm 1022, and the drive coil 1021 is connected to the frame 101 through the first torsion arm 103.

Figure 3:
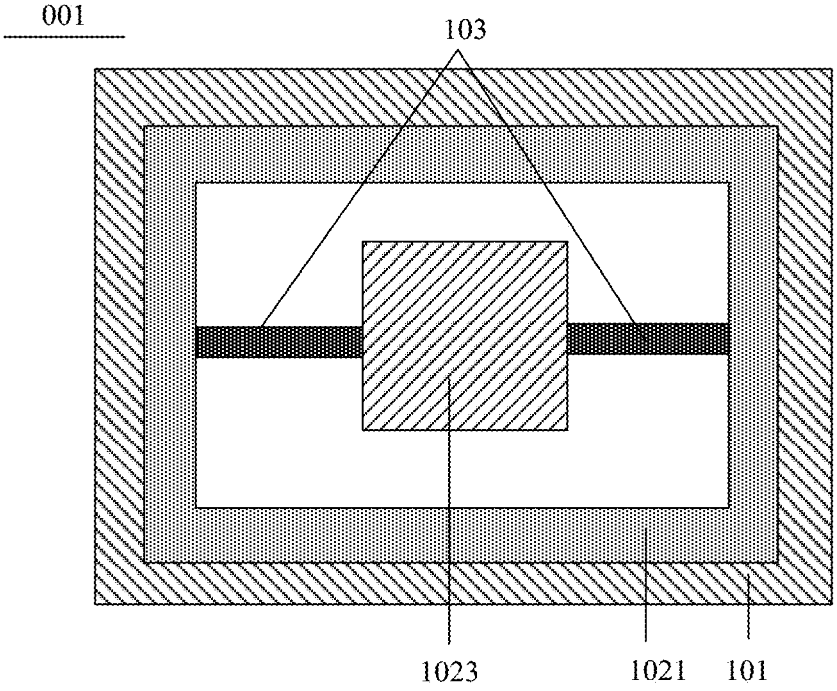
FIG. 3 is a diagram of a structure of a micromirror chip for implementing one-dimensional beam scanning.

FIG. 3 is a diagram of a structure of another micromirror chip 001. The structure includes a micromirror 1023, a first torsion arm 103, a drive coil 1021, and a frame 101. The micromirror 1023 is connected to the drive coil 1021 through the first torsion arm 103, and the drive coil 1021 is fastened to the frame 101. In this way, under the action of Lorentz force, the drive coil 1021 may drive the micromirror 1023 to rotate around the first torsion arm 103 relative to the frame 100, to implement one-dimensional beam scanning.

Figure 4:
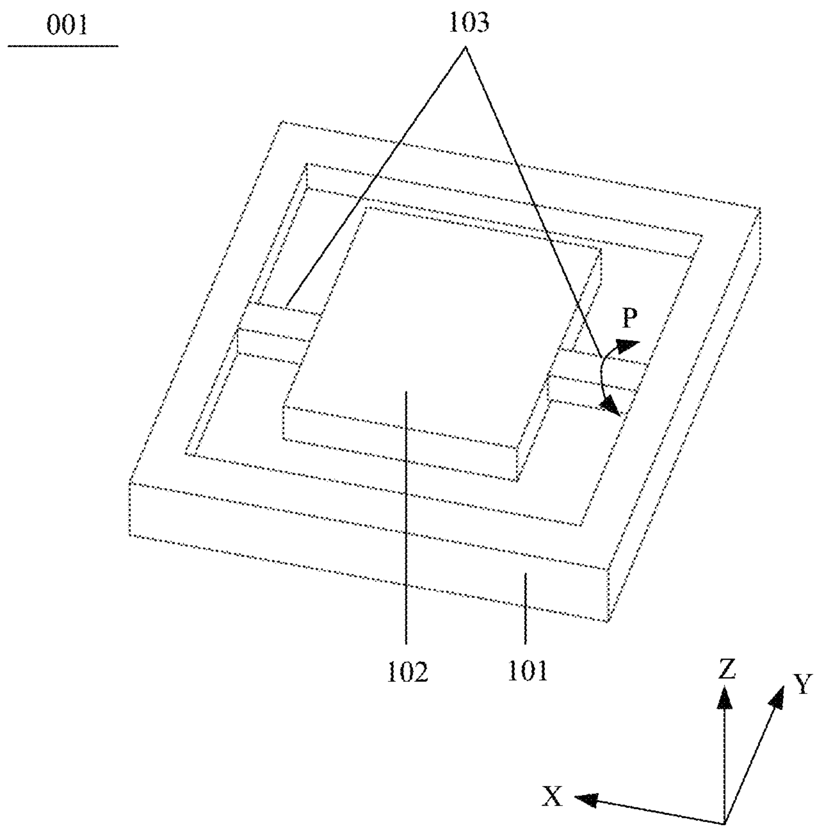
FIG. 4 is a diagram of a structure of a micromirror chip.

It may be understood that the structure of the micromirror chip 001 shown in FIG. 2 and the structure of the micromirror chip 001 shown in FIG. 3 may be summarized as a structure shown in FIG. 4. In other words, the micromirror chip 001 mainly includes the frame 101, a movable component 102, and the first torsion arm 103. The movable component 102 is connected to the frame 101 through the first torsion arm 103. When the micromirror chip 001 is a one-dimensional scanning micromirror chip, the movable component 102 herein may include the micromirror 1023. When the micromirror chip 001 is a two-dimensional scanning micromirror chip, in addition to the micromirror 1023, the movable component 102 herein may further include the drive coil 1021, and the second torsion arm 1022 that connects the drive coil 1021 and the micromirror 1023.

During working, a motion mode of the two-dimensional scanning micromirror chip 001 shown in FIG. 2 or the one-dimensional scanning micromirror chip 001 shown in FIG. 3 may include a torsion mode and a vibration mode.

Figure 5:
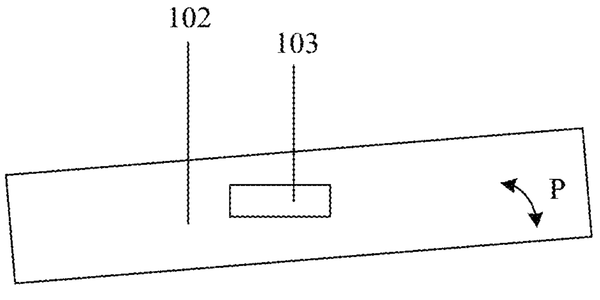
FIG. 5 is a simple schematic diagram of a micromirror chip in a torsion mode.

FIG. 4 is a schematic diagram of a working state of the micromirror chip 001 in the torsion mode, and FIG. 5 is a schematic diagram of a simplified structure in FIG. 4. With reference to FIG. 4 and FIG. 5, in the torsion mode, the movable component 102 rotates around the first torsion arm 103 (that is, in a P direction in the figure), and a rotation angle is related to torsion force on the micromirror chip 001.

Figure 6:
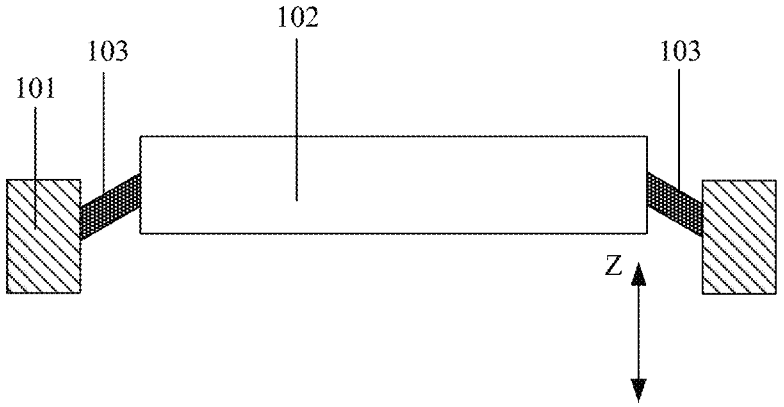
FIG. 6 is a simple schematic diagram of a micromirror chip in a vibration mode.

In addition, FIG. 6 is a schematic diagram of a simplified structure of the micromirror chip in the vibration mode. As shown in FIG. 6, in the vibration mode, the movable component 102 and the first torsion arm 103 vibrate relative to the frame 101, and a vibration amplitude is related to vibration strength of the micromirror chip.

Because the micromirror chip 001 is of a symmetrical structure, in the torsion mode, torque generated by an acceleration of rotation is symmetrical relative to the micromirror chip 001, and can cancel each other out. In addition, the micromirror is designed to work in the rotation mode, and the micromirror chip has a high degree of tolerance to torsion. Therefore, the micromirror chip is not prone to excessive deformation or rotation.

In the vibration mode, force generated by an acceleration of shock vibration completely acts on the micromirror chip 001, and cannot cancel each other out. When a magnitude of the shock vibration is large, excessive deformation and damage of the first torsion arm 103 are easily caused. For example, when the laser device is disposed on a vehicle or an intelligent robot, in a working state, the vehicle or the intelligent machine easily vibrates at a low frequency, and due to impact of an up-and-down vibration mode, large deformation displacement occurs in a Z direction shown in FIG. 6 during shock and vibration tests. Stress on the first torsion arm 103 is far higher than material yield stress, and the first torsion arm 103 may be broken and damaged and cannot pass an automotive-grade test or an intelligent robot shockproof test.

Embodiments of this application provide a micromirror chip package structure including a micromirror chip 10, to resolve, without affecting beam scanning of the micromirror chip 10, a problem that the micromirror chip 10 is damaged due to excessive stress during shock and vibration.

Figure 7:
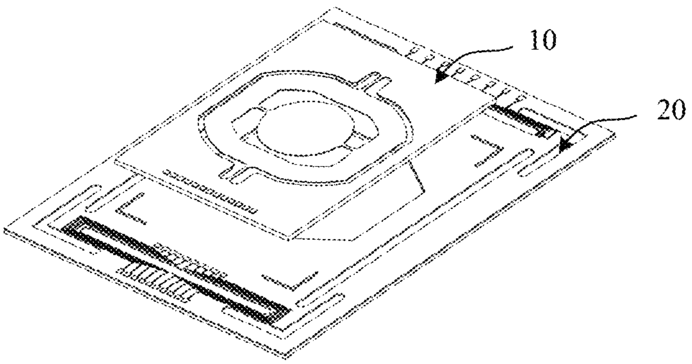
FIG. 7 is a schematic exploded view of a micromirror chip package structure according to an embodiment of this application.
Figure 8:
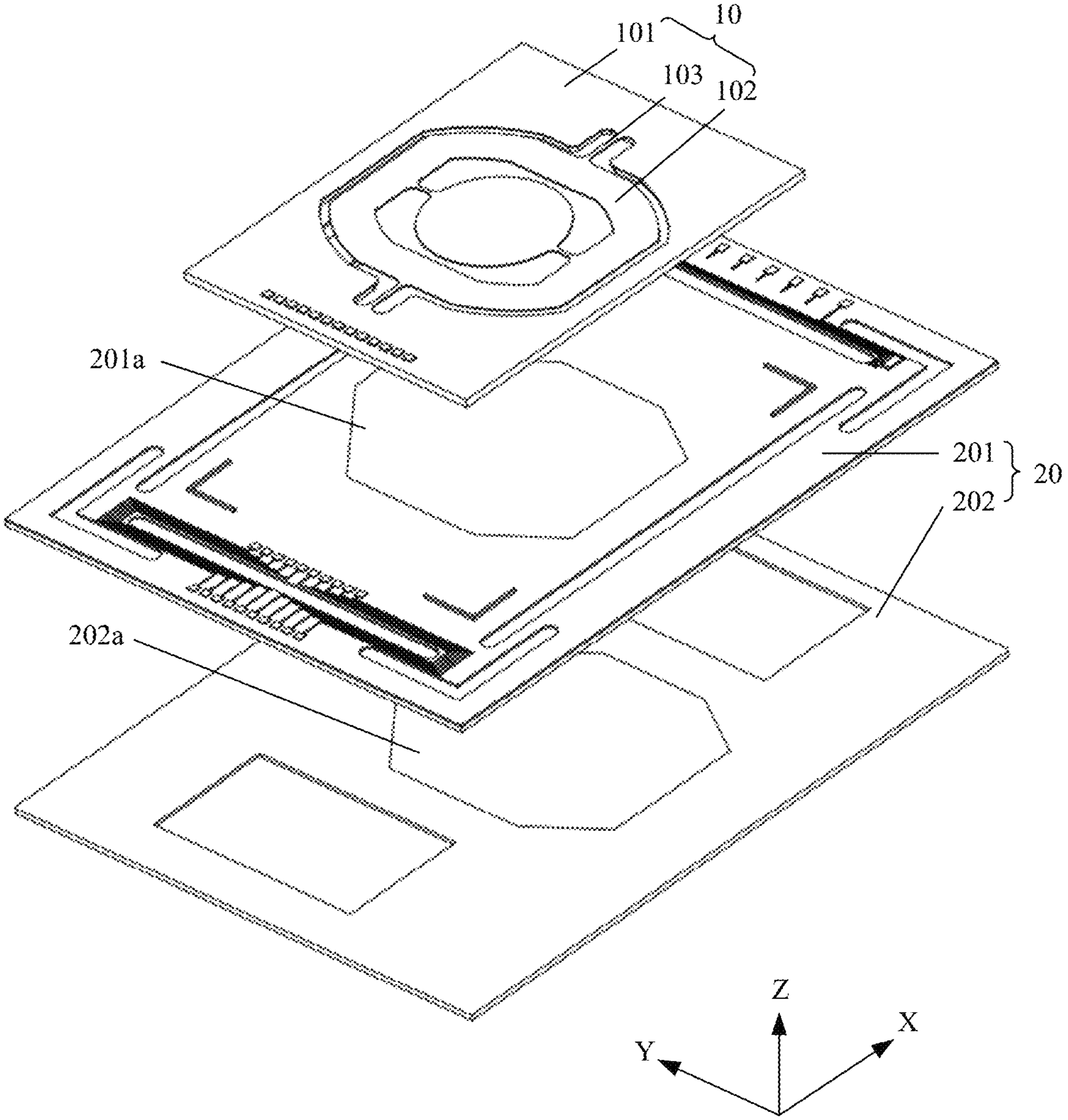
FIG. 8 is a schematic exploded view of a micromirror chip package structure according to an embodiment of this application.

FIG. 7 is a schematic exploded view of a micromirror chip package structure according to an embodiment of this application, and FIG. 8 is a schematic diagram obtained after FIG. 7 is further exploded. As shown in FIG. 7 and FIG. 8, in addition to the micromirror chip 10, the micromirror chip package structure further includes a vibration isolation substrate 20 that is stacked with the micromirror chip 10, that is, the micromirror chip 10 is packaged on the vibration isolation substrate 20.

The micromirror chip 10 may include a frame 101, a movable component 102, and a first torsion arm 103 shown in FIG. 8. The movable component 102 is connected to the frame 101 through the first torsion arm 103. A structure included in the movable component 102 herein is explained above, and details are not described herein again.

Figure 9:
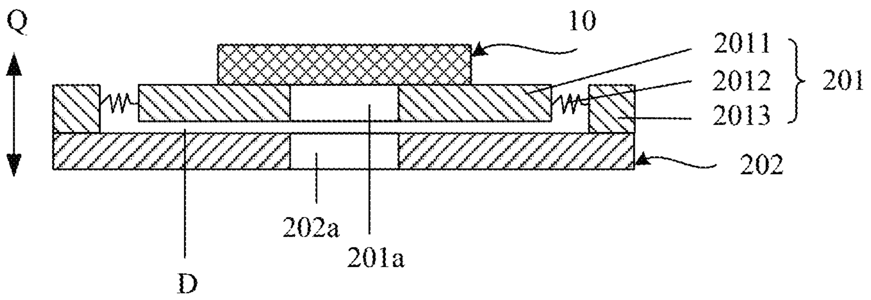
FIG. 9 is a sectional view of a micromirror chip package structure according to an embodiment of this application.

FIG. 9 is a sectional view of the micromirror chip package structure according to an embodiment of this application. With reference to FIG. 8 and FIG. 9, the vibration isolation substrate 20 includes a first substrate 201 and a second substrate 202, the first substrate 201 and the second substrate 202 are stacked in a Q direction shown in FIG. 9, and the micromirror chip 10 is disposed on a side that is of the first substrate 201 and that faces away from the second substrate 202. In other words, the micromirror chip 10, the first substrate 201, and the second substrate 202 are sequentially stacked in the Q direction.

In addition, as shown in FIG. 9, the first substrate 201 includes a vibration isolation platform 2011, an elastic beam 2012, and a support frame 2013. The micromirror chip 10 is disposed on the vibration isolation platform 2011, and the vibration isolation platform 2011 is connected to the support frame 2013 through the elastic beam 2012.

It can be seen from the micromirror chip 10 shown in FIG. 8 that, since the movable component 102 is connected to the frame 101 through the first torsion arm 103, the micromirror chip 10 is a single-degree-of-freedom system. As shown in FIG. 9, the vibration isolation platform 2011 carrying the micromirror chip 10 is connected to the support frame 2013 through the elastic beam 2012. Therefore, the vibration isolation platform 2011 carrying the micromirror chip 10, the elastic beam 2012, and the support frame 2013 form a single-degree-of-freedom system. Therefore, refer to FIG. 10. The micromirror chip package structure provided in this application is a two-degree-of-freedom system. m2 in FIG. 10 includes a mass of the movable component 102, and an elastic component T2 connected to m2 is shown as the first torsion arm 103 in FIG. 8. m1 includes a sum of a mass of the micromirror chip 10 and a mass of the vibration isolation platform 2011, and an elastic component T1 connected to m1 is shown as the elastic beam 2012 in FIG. 9.

Figure 10:
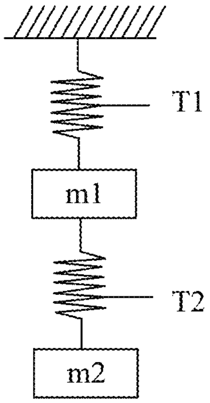
FIG. 10 is a simple schematic diagram for indicating that a micromirror chip package structure is a two-degree-of-freedom system according to an embodiment of this application.

When the micromirror chip package structure in this application is the two-degree-of-freedom system shown in FIG. 10, when the outside causes the micromirror chip package structure to vibrate, the first torsion arm 103 connected to the movable component 102 can absorb a part of vibration energy, and the elastic beam 2012 can further absorb a part of vibration energy. In this way, a vibration amplitude of the movable component 102 is significantly reduced, a possibility that the first torsion arm 103 is damaged is reduced, and performance of shock and vibration resistance is improved. In addition, in a package process, for example, when the micromirror chip package structure and a magnet (which is configured to provide magnetism for the drive coil) are packaged by using an external structure, the vibration isolation substrate is introduced, so that residual stress generated between the micromirror chip package structure and the outside during package and use can be reduced. Therefore, reliability performance of the micromirror chip package structure can be improved.

In addition, in this application, only the vibration isolation substrate 20 used to package the micromirror chip 10 needs to be improved, and another vibration isolation device does not need to be introduced. Therefore, on the basis of achieving vibration isolation effect, the entire micromirror chip package structure is not complicated, and no more mode is introduced.

It should be explained the reduced vibration amplitude of the movable component 102 in this application includes not only a vibration amplitude in a Z direction shown in FIG. 8, but also a vibration amplitude in an X direction and a Y direction shown in FIG. 8.

In an X-Y-Z coordinate system shown in FIG. 8, the vibration in the Z direction of the movable component 102 includes not only vibration in a positive direction in FIG. 8, but also vibration in a negative direction opposite to the positive direction. Similarly, the vibration in the X direction and the vibration in the Y direction of the movable component 102 may be explained with reference to the vibration in the Z direction.

Still refer to FIG. 9. A gap D is formed between the second substrate 202 and the vibration isolation platform 2011 of the first substrate 201. In this way, when the first substrate 201 carrying the micromirror chip 10 vibrates, the gap D can improve squeeze-film damping of the entire micromirror chip package structure. For example, a damping ratio of the entire two-degree-of-freedom system may reach 0.5 to 0.7, thereby further suppressing the vibration amplitude of the movable component 102.

In some embodiments, a thickness of the gap D in the stacking direction is 10 μm to 30 μm. For example, the thickness of the gap D may be 10 μm to 20 μm. For another example, the thickness of the gap D may be 15 μm to 30 μm. Certainly, another value range may also be selected. A specific value of the gap D may be selected based on the damping ratio of the entire two-degree-of-freedom system.

Figure 11:
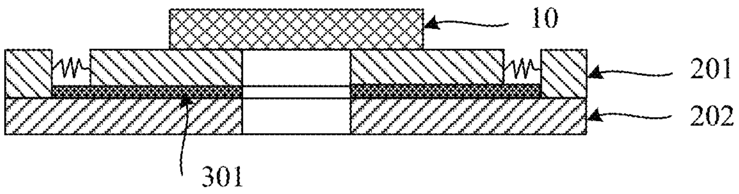
FIG. 11 is a sectional view of a micromirror chip package structure according to an embodiment of this application.
Figure 12:
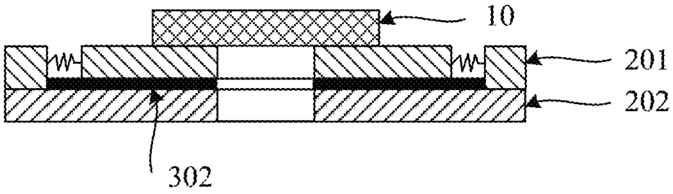
FIG. 12 is a sectional view of a micromirror chip package structure according to an embodiment of this application.

The gap D in FIG. 9 may include gas, or the gap D may be filled with a damping medium, to further increase a damping coefficient. For example, as shown in FIG. 11, the gap D may be filled with a liquid damping medium 301. For example, the liquid damping medium 301 may include grease (which may be waterborne acrylic emulsion, damping lubricating oil, or the like). For another example, as shown in FIG. 12, the gap D may be filled with a solid damping medium 302. For example, the solid damping medium 302 may include at least one of rubber, an anisotropic conductive film (anisotropic conductive film, ACF) vibration absorption material, silica gel, a Parylene (Parylene) vacuum coating, and plastic. For example, the solid damping medium 302 may be specifically butyl, acrylate, polysulfide, nitrile, silicone rubber, polyurethane, polyvinyl chloride, and epoxy resin. Alternatively, another solid damping medium may be mixed into the solid damping medium, for example, a copper-zinc-aluminum alloy, an iron-chromium-molybdenum, a manganese-copper alloy, and the like. For another example, the gap D may be filled with a mixed damping medium including the liquid damping medium 301 and the solid damping medium 302.

The gap D can be formed in a plurality of manners. For example, in some optional implementations, as shown in FIG. 9, FIG. 11, and FIG. 12, a groove is formed on surfaces that are of the vibration isolation platform 2011 and the elastic beam 2012 and that face the second substrate 202, and the groove forms the gap D. For another example, in some other optional implementations, a groove may be formed on a surface that is of the second substrate 202 and that faces the vibration isolation platform 2011 and the elastic beam 2012, and the groove forms the gap D.

When the groove is formed on the surfaces that are of the vibration isolation platform 2011 and the elastic beam 2012 and that face the second substrate 202, as shown in FIG. 9, a thickness in the stacking direction Q of the vibration isolation platform 2011 configured to carry the micromirror chip 10 can be reduced, an elastic modulus of the vibration isolation platform 2011 can be improved, vibration energy absorbed by the first substrate 201 can be further increased, and a vibration amount of the movable component 102 can be further reduced. In addition, from a process perspective, it is easy to dispose the groove on the first substrate 201, to form the groove. For example, when the first substrate 201 is a silicon substrate, the groove can be easily disposed on the silicon substrate, which is easy in process implementation. In addition, it is easy to control a size of the groove, to meet a designed damping coefficient requirement.

With reference to FIG. 9, FIG. 11, and FIG. 12, for the first substrate 201 and the second substrate 202 that are stacked, the first substrate 201 may be fastened to the second substrate 202 through the support frame 2013 of the first substrate 201, so that the first substrate 201 and the second substrate 202 are fastened.

The support frame 2013 may be fastened to the second substrate 202 by using an adhesive layer, or may be connected by using a bonding structure. For example, when the support frame 2013 and the second substrate 202 are connected by using the bonding structure, a size of the gap D in the stacking direction Q may be accurately controlled. Because the size of the gap D in the stacking direction Q affects the damping ratio of the entire two-degree-of-freedom system, during process, the size of the gap D in the stacking direction Q needs to strictly meet a design requirement, otherwise the two-degree-of-freedom system after assembly may not meet the design requirement.

To prevent the first substrate 201 and the second substrate 202 from interfering with the movable component 102, as shown in FIG. 8, FIG. 9, FIG. 11, and FIG. 12, the vibration isolation platform 2011 of the first substrate 201 and the second substrate 202 each have a hollow area, and the hollow area is opposed to the movable component 102 to accommodate the movable component 102. The hollow area disposed on the vibration isolation platform 2011 may be referred to as a first hollow area 201*a*, and the first hollow area 201*a* penetrates the vibration isolation platform 2011. The hollow area disposed on the second substrate 202 may be referred to as a second hollow area 202*a*, and the second hollow area 202*a* penetrates the second substrate 202. In addition, the second hollow area 202*a* is opposite to the first hollow area 201*a*, and the first hollow area 201*a* is opposed to the movable component 102. In this way, when the movable component 102 moves, the first hollow area 201*a* and the second hollow area 202*a* can provide space for the movable component 102 that is moving, to prevent the first substrate 201 and the second substrate 202 from interfering with movement of the movable component 102.

Figure 13A:
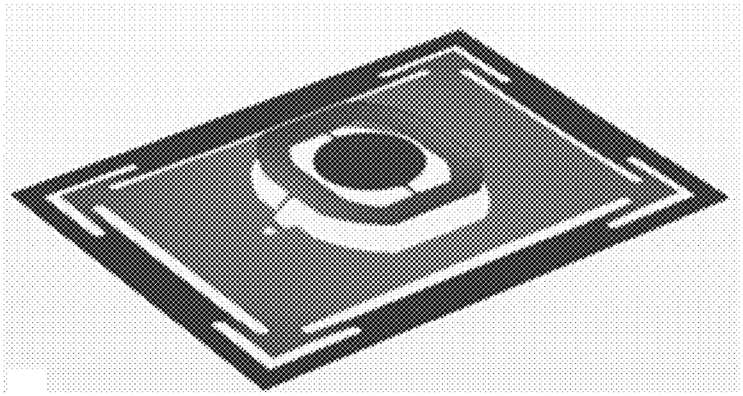
FIG. 13*a* is a simulation diagram of a vibration mode of a micromirror chip package structure according to an embodiment of this application.
Figure 13B:
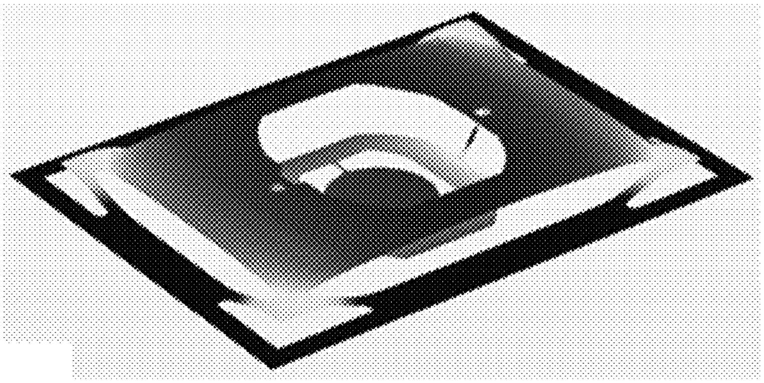
FIG. 13*b* is a simulation diagram of another vibration mode of a micromirror chip package structure according to an embodiment of this application.

FIG. 13*a* and FIG. 13*b* are simulation result diagrams of the micromirror chip package structure according to this application, and both FIG. 13*a* and FIG. 13*b* are vibration mode diagrams in the simulation results. Compared with a single-degree-of-freedom micromirror chip package structure in the conventional technology, a vibration mode shown in FIG. 13*b* is added to the vibration mode provided in this application. FIG. 13*a* shows moving directions of the micromirror chip 10 and the vibration isolation substrate 20 when a frequency is 905 Hz. It can be learned from FIG. 13*a* that the moving directions of the micromirror chip 10 and the vibration isolation substrate 20 are the same. Because the vibration isolation substrate 20 is introduced in this application, most of vibration energy can be absorbed by the vibration isolation substrate 20, so that a deformation amount of the first torsion arm in the micromirror chip 10 is reduced. FIG. 13*b* shows movement directions of the micromirror chip 10 and the vibration isolation substrate 20 when a frequency is 1525 Hz. It can be learned from FIG. 13*b* that the movement directions of the micromirror chip 10 and the vibration isolation substrate 20 are opposite. Similarly, because the vibration isolation substrate 20 is introduced in this application, most of the vibration energy can be absorbed by the vibration isolation substrate 20, and the deformation amount of the first torsion arm in the micromirror chip 10 is small.

Figure 14:
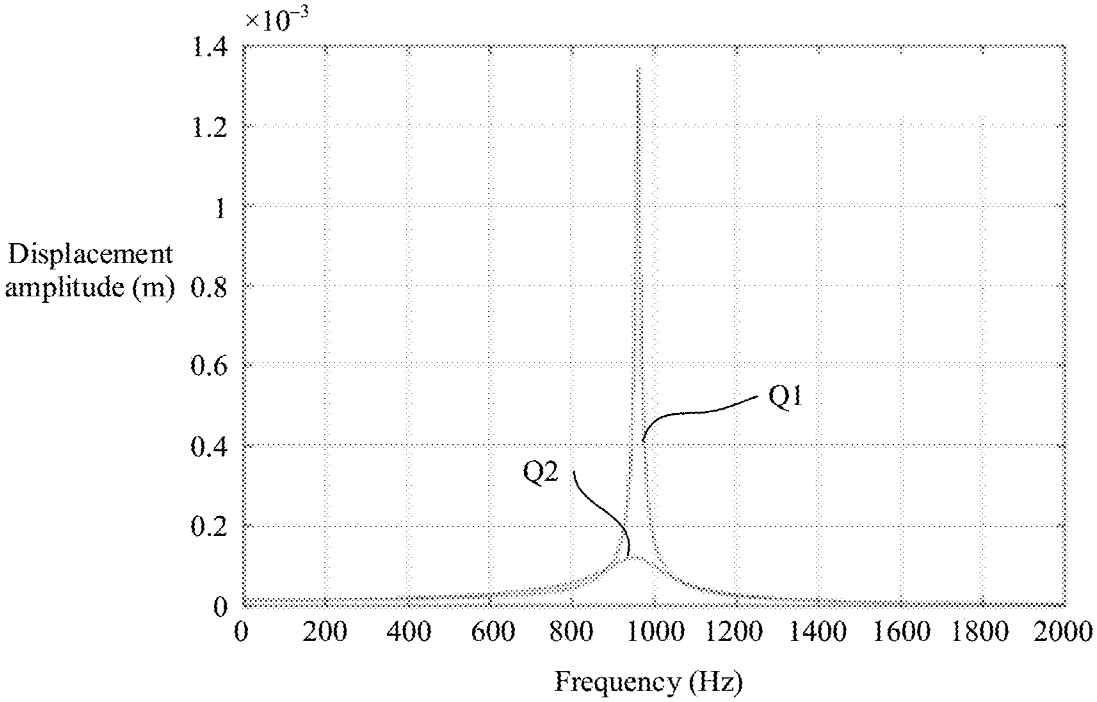
FIG. 14 is a curve diagram of comparison between displacement amplitudes of a micromirror chip and an existing micromirror chip according to an embodiment of this application.

FIG. 14 shows a relationship between a vibration frequency and a displacement amplitude of the micromirror chip according to this application and a relationship between a vibration frequency and a displacement amplitude of an existing micromirror chip without a vibration isolation substrate package in 50 G frequency sweep vibration simulation. A curve Q1 is a curve of the relationship between the vibration frequency and the displacement amplitude of the micromirror chip in the conventional technology, and a curve Q2 is a curve of the relationship between the vibration frequency and the displacement amplitude of the micromirror chip in this application. It can be seen from comparison of the curve Q1 and the curve Q2 that the vibration isolator can implement attenuation effect of −20 dB in a sensitive mode of the micromirror. Therefore, in this application, an amplitude of the micromirror chip 20 can be significantly reduced by introducing the vibration isolation substrate 20, and a probability that the first torsion arm 102 is damaged is reduced.

The micromirror chip 10, the first substrate 201, and the second substrate 202 have various shapes. For example, as shown in FIG. 8, the shape of the micromirror chip 10, the first substrate 201, or the second substrate 202 may be of a rectangular structure. For another example, the shape of the micromirror chip 10, the first substrate 201, or the second substrate 202 may be of a circular structure. Certainly, there may be another shape, which is not listed exhaustively listed herein.

In some implementations, the shapes of the micromirror chip 10, the first substrate 201, and the second substrate 202 may be different. In some other implementations, the micromirror chip 10, the first substrate 201, and the second substrate 202 may have same shapes as those shown in FIG. 8.

The elastic beam 2012 of the first substrate 201 is arranged in a plurality of manners. For example, the elastic beam 2012 may be symmetrically arranged relative to the micromirror chip 10. For another example, the elastic beam 2012 may be asymmetrically arranged relative to the micromirror chip 10. When the elastic beam 2012 is symmetrically arranged relative to the micromirror chip 10, generation of a mode that is likely to cause the first torsion arm 103 to break can be avoided, that is, another disorderly mode is not introduced, and a mode of the entire two-degree-of-freedom system is not complicated.

Figure 15:
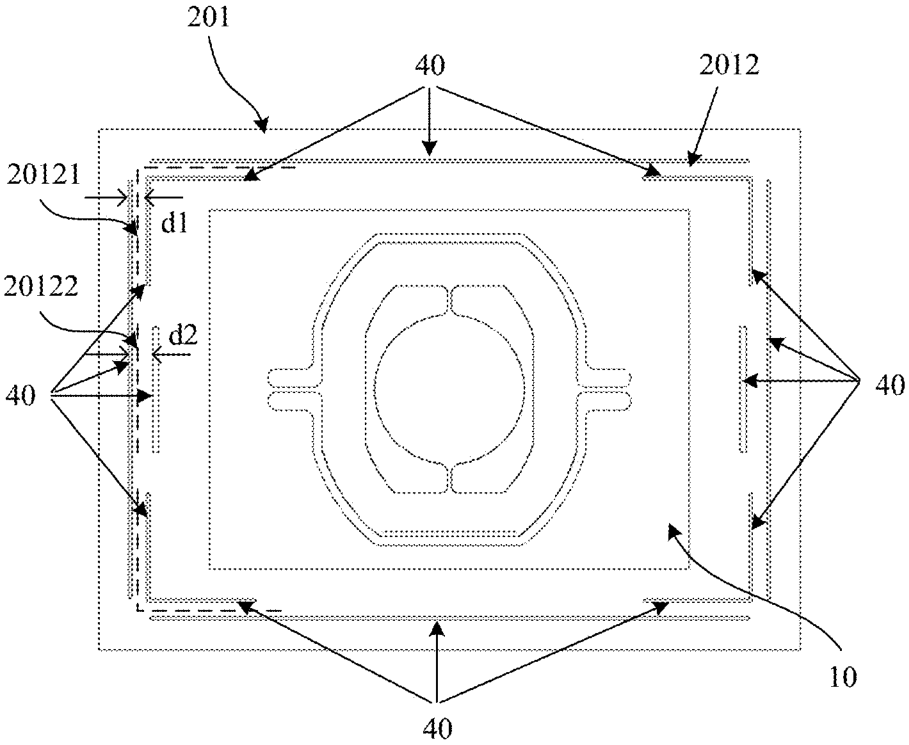
FIG. 15 is a curve diagram of comparison between displacement amplitudes of micromirror chips in different systems according to an embodiment of this application.
Figure 16:
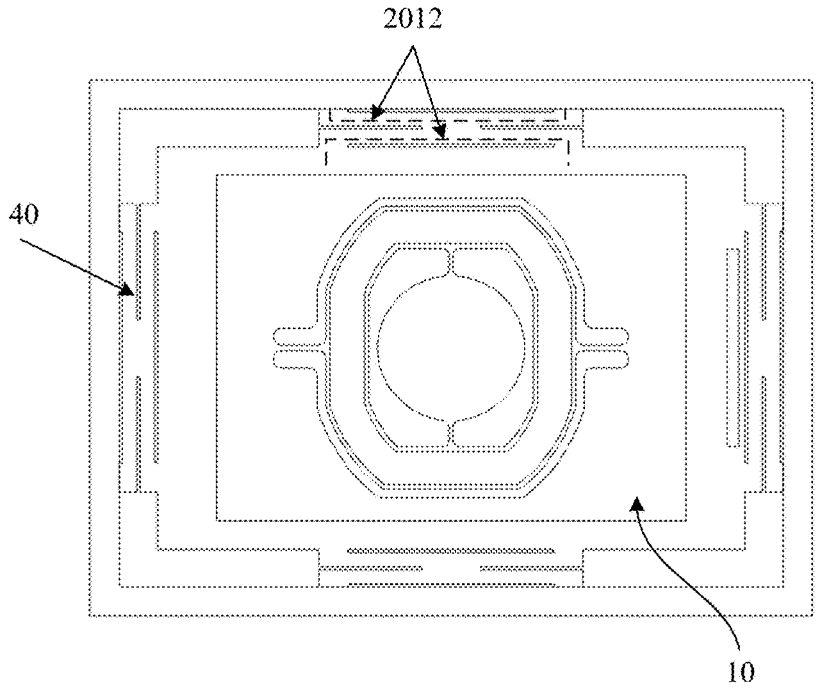
FIG. 16 is a diagram of a structure of an elastic beam in a micromirror chip package structure according to an embodiment of this application.

The elastic beam 2012 can be formed in a plurality of manners. As shown in FIG. 15 and FIG. 16, one manner of forming the elastic beam 2012 is provided. Specifically, a plurality of hollow areas 40 may be formed on the first substrate 201 and outside a mounting position of the micromirror chip 10 by using an etching process, and the elastic beam 2012 may be formed at parts that are of the first substrate 201 and that are on sides of the hollow areas 40.

There are a plurality of cases in which the elastic beam 2012 is arranged. In some implementations, as shown in FIG. 15, four corners of the rectangular first substrate 201 each have the elastic beam 2012. In addition, the elastic beam 2012 is also formed in a side position of the rectangular first substrate 201. In some designs, the elastic beam 2012 may be disposed on some sides of the rectangular first substrate 201, or the elastic beam 2012 may be disposed on each side of the rectangular first substrate 201. In some other implementations, as shown in FIG. 16, no elastic beam 2012 is disposed at the four corners of the rectangular first substrate 201, but the elastic beam 2012 is disposed at each side of the rectangular first substrate 201.

In addition, a shape of the elastic beam 2012 is not limited in this application. For example, in FIG. 15, an elastic beam 20121 in an "L"-shaped structure is included, and an elastic beam 20122 in a straight line shape is further included. For another example, in FIG. 16, the elastic beam 2012 in a "U"-shaped structure is included, and two elastic beams 2012 in the "U"-shaped structure may be disposed back to back, that is, opening parts of the "U"-shaped structure are disposed back to back.

In a micromirror chip package structure, a width of the elastic beam 2012 may be unique and unchanged, or may be a width d1 of the elastic beam 20121 in the "L"-shaped structure shown in FIG. 16, which is less than a width d2 of the elastic beam 20122 in the straight line shape. In other words, the width of the elastic beam 2012 is variable.

Based on the foregoing description, in this application, the shape, the position, the forming manner, and the like of the elastic beam 2012 are not specifically limited, provided that it can be ensured that a final elastic coefficient of the two-degree-of-freedom system meets the design requirement.

During design, the damping ratio of the two-degree-of-freedom system can be adjusted by changing the shape and the position of the elastic beam, and changing the size of the gap, so that the isolation substrate 20 is applicable to different types of micromirror chips.

Figure 17:
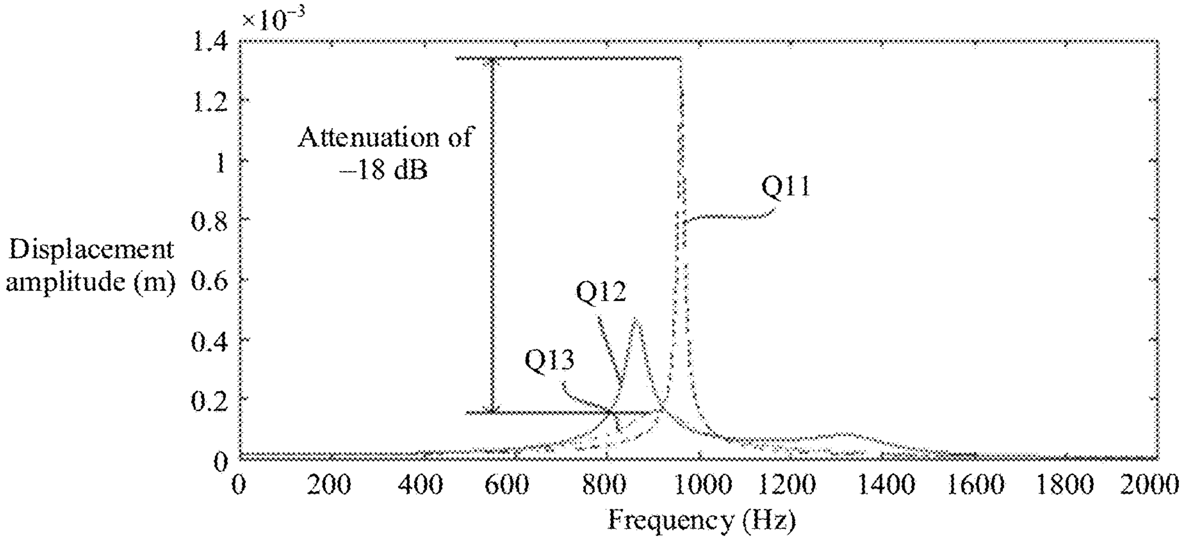
FIG. 17 is a diagram of a structure of another elastic beam in a micromirror chip package structure according to an embodiment of this application.

FIG. 17 shows comparison of vibration isolation effect of three vibration isolation substrates with different damping ratios. Similarities of the three different systems lie in that a stiffness coefficient K=4500 N/m, a first-order natural frequency is 861 Hz, and a second-order natural frequency is 1348 Hz. Differences lie in that a curve Q11 is a displacement amplitude curve of the micromirror chip when no vibration isolation substrate is disposed, a curve Q12 is a displacement amplitude curve of the micromirror chip when the vibration isolation substrate is disposed, and a damping ratio C1=0.1 kg/s, and a curve Q13 is a displacement amplitude curve of the micromirror chip when the vibration isolation substrate is disposed, and a damping ratio C1=0.5 kg/s. It can be seen from comparison of the three curves Q11, Q12, and Q13 that when the damping ratio is increased by changing the structure and the position of the elastic beam, and changing the size of the gap, the vibration isolation effect is better. For example, when the damping ratio C1=0.5 kg/s, the two-degree-of-freedom system with the vibration isolation substrate disposed can implement attenuation of −18 dB compared with the two-degree-of-freedom system without the vibration isolation substrate disposed.

Figure 18:
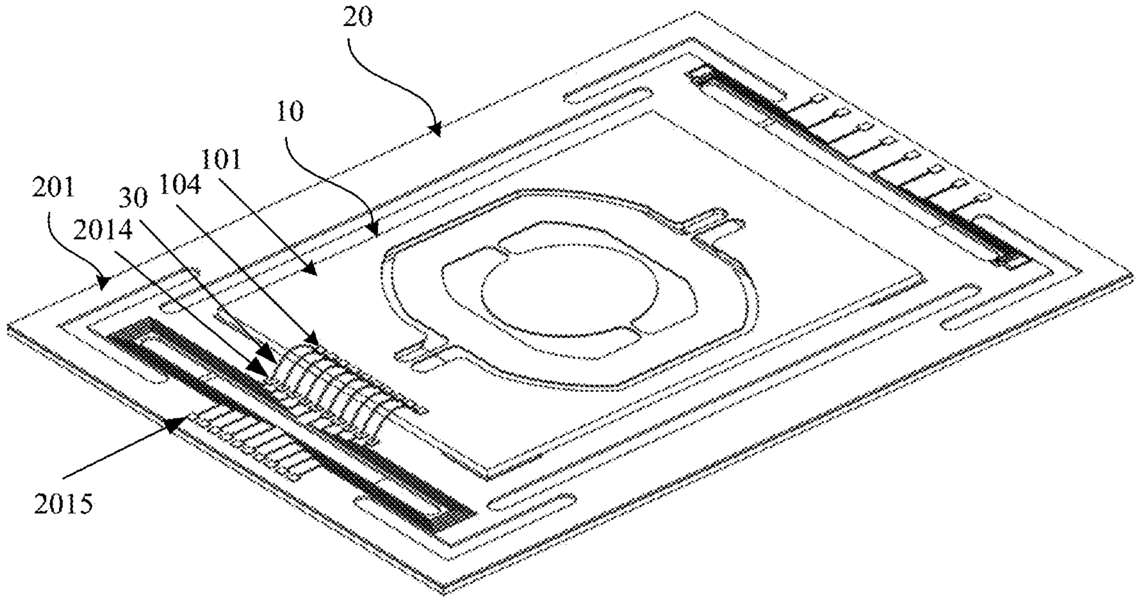
FIG. 18 is an assembly diagram of a micromirror chip package structure according to an embodiment of this application.
Figure 19:
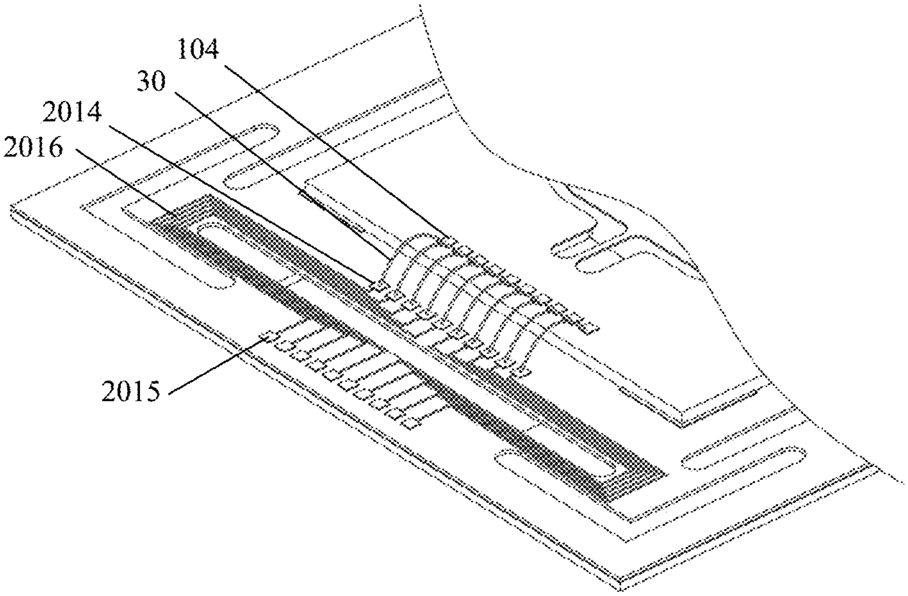
FIG. 19 is a partial assembly diagram of a micromirror chip package structure according to an embodiment of this application.

During specific implementation, the micromirror chip 10 needs to be electrically connected to an electronic component disposed outside the micromirror chip package structure. For example, the micromirror chip 10 needs to be electrically connected to a controller on a circuit board. In other words, the controller controls the micromirror in the micromirror chip 10 to rotate around the first torsion arm 103 or around the second torsion arm 1022. In this case, as shown in FIG. 18 and FIG. 19, FIG. 18 shows a diagram of an assembled structure of the micromirror chip 10 and the vibration isolation substrate 20, and FIG. 19 is an enlarged diagram of a partial structure of FIG. 18. A first electrode 104 is disposed on a surface that is of the frame 101 of the micromirror chip 10 and that faces away from the first substrate 201, a second electrode 2014 is disposed on a surface that is of the vibration isolation platform 2011 of the first substrate 201 and that faces the micromirror chip 10, and the first electrode 104 and the second electrode 2014 are electrically connected through a lead 30.

The micromirror chip 10 is disposed on the vibration isolation platform 2011, and the frame 101 of the micromirror chip 10 and the vibration isolation platform 2011 are fastened. Therefore, when vibration is applied to the micromirror chip package structure from the outside, the frame 101 and the vibration isolation platform 2011 basically do not move relatively, and further, the lead 30 connecting the first electrode 104 and the second electrode 2014 is substantially not subject to large pulling force. This avoids damage to the lead 30.

Figure 20:
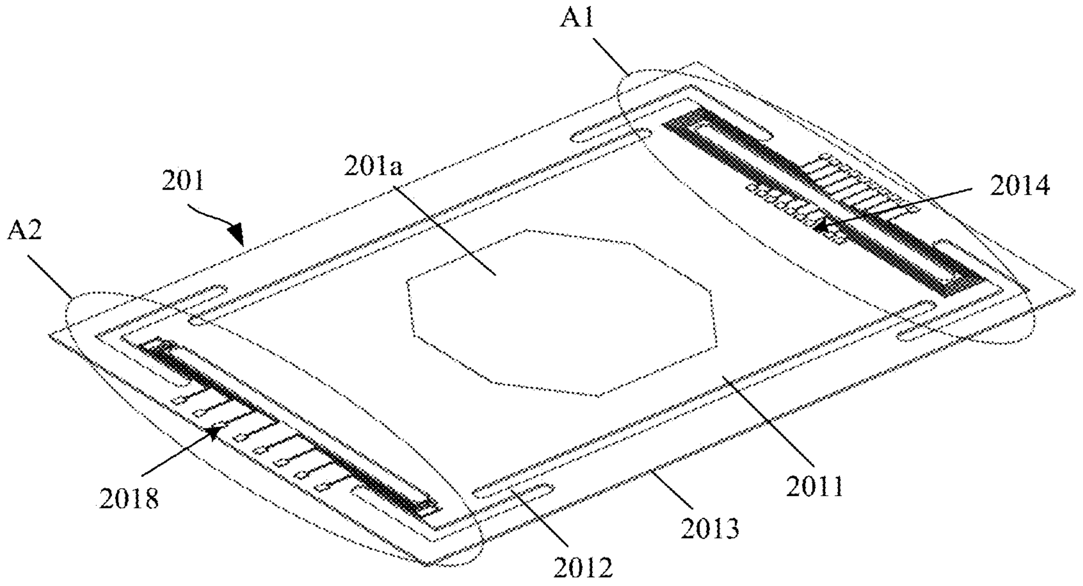
FIG. 20 is a diagram of a structure of a first substrate in a micromirror chip package structure according to an embodiment of this application.
Figure 21:
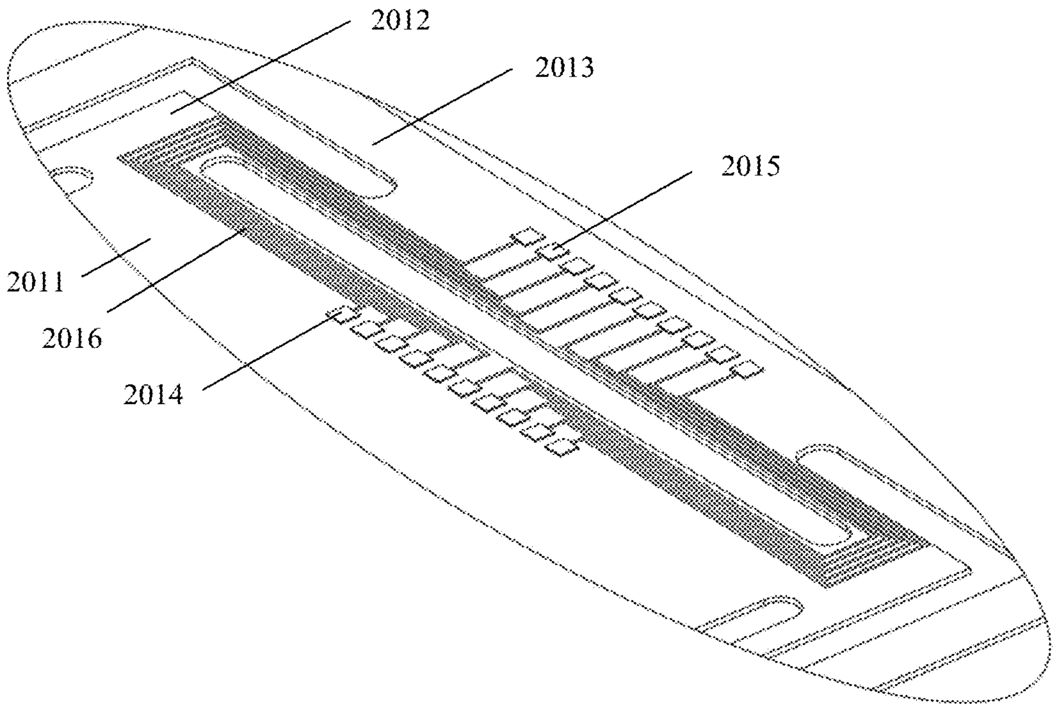
FIG. 21 is an enlarged diagram at A1 in FIG. 20.

In addition, as shown in FIG. 20 and FIG. 21, FIG. 20 is a diagram of a structure of the first substrate 201, and FIG. 21 is an enlarged diagram at A1 in FIG. 20. As shown in FIG. 20 and FIG. 21, a third electrode 2015 exists on a surface that is of the support frame 2013 of the first substrate 201 and that faces the micromirror chip 10. A first metal cable 2016 is further formed on the first substrate 201, and the first metal cable 2016 is arranged along the elastic beam 2012. The second electrode 2014 and the third electrode 2015 are electrically connected through the first metal cable 2016, and the third electrode 2015 is electrically connected to an externally disposed electronic component through the lead. In this way, signal interworking between the micromirror chip and the externally disposed electronic component is implemented.

The first metal cable 2016 herein is arranged along the elastic beam 2012. It may be understood that, for example, the hollow area used to form the elastic beam 2012 may be etched on the first substrate 201. In this case, the first metal cable 2016 may be arranged along the first substrate 201 on the side of the hollow area, to electrically connect the second electrode 2014 and the third electrode 2015.

Figure 22:
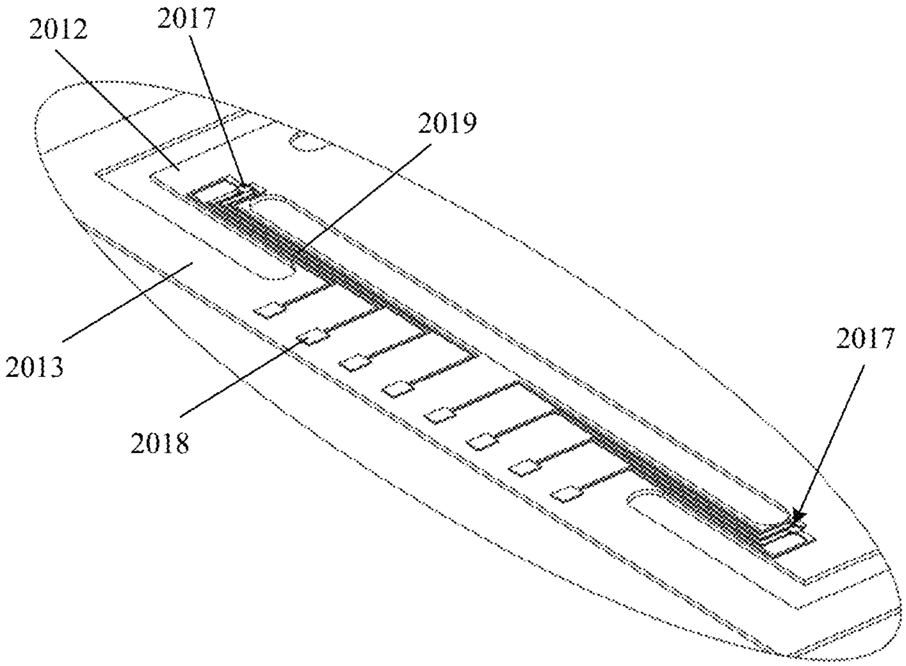
FIG. 22 is an enlarged diagram at A2 in FIG. 20.

When the micromirror chip package structure is used, to detect a form of the elastic beam 2012, that is, whether the elastic beam 2012 is in a damaged or broken form, or in an intact form. As shown in FIG. 22, FIG. 22 is an enlarged diagram at A2 in FIG. 20. A sensor 2017 may be disposed on the elastic beam 2012, and the sensor 2017 is configured to detect a deformation amount of the elastic beam 2012. Therefore, in an alternative embodiment, the sensor 2017 is disposed in a position that is of the elastic beam 2012 and that has a large deformation amount. As shown in FIG. 22, the elastic beam 2012 located at the four corners of the first substrate 201 has a large deformation amount, namely, areas that are prone to damage. In this way, the sensor 2017 may be disposed in the corner area.

A quantity of sensors 2017 is not limited in this application. For example, there may be one sensor 2017, or there may be a plurality of sensors 2017. When there are a plurality of sensors 2017, the plurality of sensors 2017 may be arranged in different positions that have a large deformation amount. In a structure shown in FIG. 22, two sensors 2017 are disposed, and the two sensors 2017 are disposed at two different corners.

The sensor 2017 configured to detect the deformation amount of the elastic beam 2012 herein may be a piezoresistive sensor, may be a capacitive sensor, or may be a sensor of another structure.

For example, when the piezoresistive sensor is used, the piezoresistive sensor may be formed on the first substrate 201 through ion implantation, or when the capacitive sensor is used, the capacitive sensor may be formed by etching the first substrate 201. The sensor formed in this way is not only simple in structure, but also easy to implement from a process perspective.

During specific implementation, the sensor needs to be electrically connected to an electronic component disposed outside the micromirror chip package structure. In this case, as shown in FIG. 22, a fourth electrode 2018 may exist on a surface that is of the first substrate 201 and that faces the micromirror chip 10. A second metal cable 2019 is further formed on the first substrate 201. The sensor 2017 and the fourth electrode 2018 are electrically connected through the second metal cable 2019. The fourth electrode 2018 is electrically connected to the external electronic component, for example, is electrically connected to a controller, to monitor a magnitude of external vibration and the form of the elastic beam 2012 by detecting the deformation amount of the elastic beam 2012.

A disposing position of the fourth electrode 2018 and a disposing position of the second electrode 2014 may be arranged on two opposite sides of the first substrate 201 shown in FIG. 20, or may be arranged on a same side of the first substrate 201. The disposing positions of the fourth electrode 2018 and the second electrode 2014 are not limited herein.

In addition, the fourth electrode 2018 may be disposed on the vibration isolation platform 2011 of the first substrate 201, or may be disposed on the support frame 2013 as shown in FIG. 22. When the fourth electrode 2018 is disposed on the support frame 2013, the second metal cable 2019 may be disposed along the elastic beam 2012.

Figure 23:
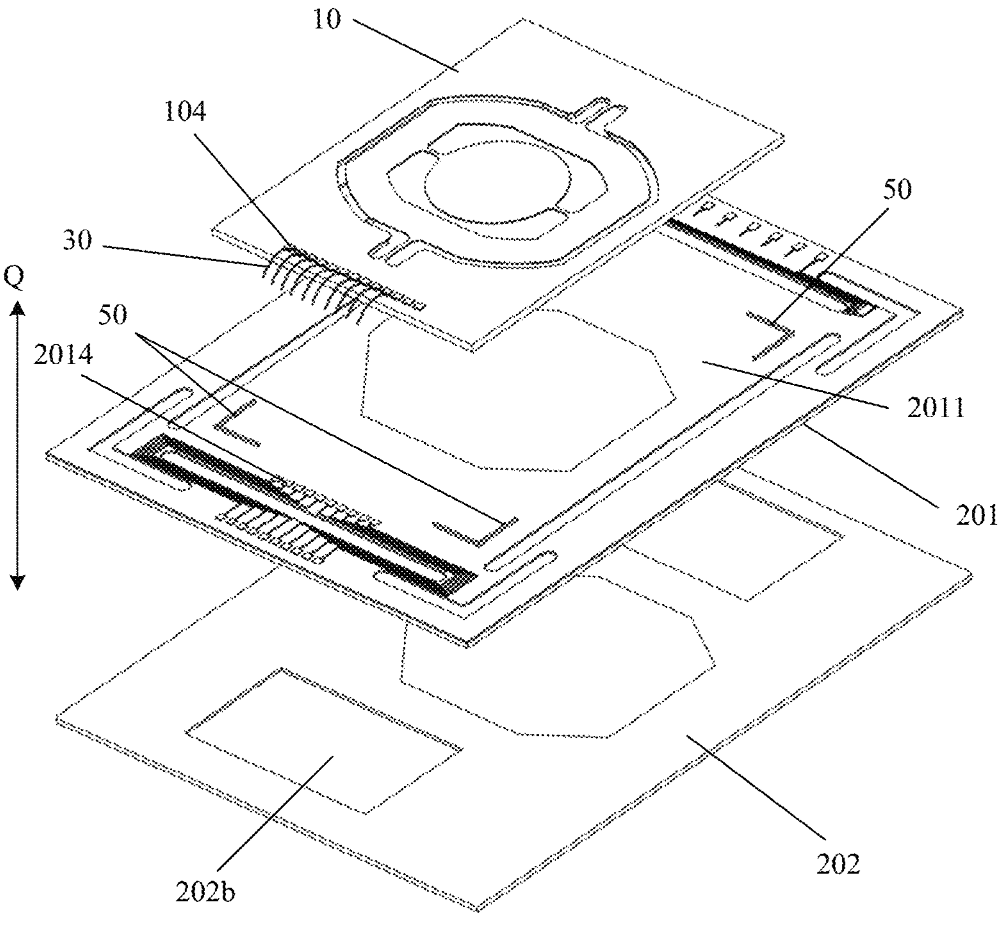
FIG. 23 is an exploded view of a micromirror chip package structure according to an embodiment of this application.

FIG. 23 is a schematic exploded view of the micromirror chip package structure. As shown in FIG. 23, the first electrode 104 of the micromirror chip 10 needs to be electrically connected to the second electrode 2014 on the first substrate 201 through the lead 30. The lead 30 herein is formed by using a wire-bonding (wire-bonding) process, that is, two ends of the lead 30 are respectively welded to the corresponding first electrode 104 and the corresponding second electrode 2014 by using a conducting wire. To avoid poor welding caused by the wire-bonding process or relatively large warpage of the first substrate 201 and the micromirror chip 10 caused by the welding, as shown in FIG. 23, a support hole **202*b* may be disposed in a position that is of the second substrate 202 and that is opposite to the lead 30. In addition, the support hole 202*b* penetrates the second substrate 202 in the stacking direction Q, and the support hole 202*b* is used for a support platform to pass through, so that the support platform supports parts that are of the frame 101 of the micromirror chip 10 and the vibration isolation platform 2013 of the first substrate 201 and that are used to dispose the lead 30. In other words, during the process, the support platform passing through the support hole 202***b* may be used as a support point to facilitate the wire bonding and improve electrical connection performance between the lead 30 and the first electrode 104 and between the lead 30 and the second electrode 2014.

The micromirror chip 10 and the first substrate 201 shown in FIG. 23 are two structural components independent of each other. In a manufacturing process, the micromirror chip 10 may be integrated into the first substrate 201 by using the connection structure. For example, the micromirror chip 10 and the first substrate 201 may be connected by using an adhesive. Alternatively, the micromirror chip 10 and the first substrate 201 are connected by using the bonding structure.

To enable the micromirror chip 10 to be disposed in a central area of the first substrate 201, as shown in FIG. 23, an alignment mark 50 exists on the surface that is of the vibration isolation platform 2011 and that faces the micromirror chip 10, and the alignment mark 50 is used to position the micromirror chip 10, so that the micromirror chip 10 is disposed in the central area of the first substrate 201. If the micromirror chip 10 deviates from the central area of the first substrate 201, the mode that causes the first torsion arm 103 to break may be generated. Therefore, in this application, the micromirror chip 10 can be more accurately disposed in the central area of the first substrate 201 by using the disposed alignment mark 50.

It should be noted that the micromirror chip 10 being disposed in the central area of the first substrate 201 herein may be understood as that a center of the micromirror chip 10 coincides with a center of the first substrate 201, or may be understood as that shown in FIG. 23, when both the micromirror chip 10 and the first substrate 201 are of the rectangular structure, distances from four sides of the micromirror chip 10 to central points of four corresponding sides of the first substrate 201 are equal, that is, the micromirror chip 10 of the rectangular structure is disposed in the central area of the first substrate 201.

The alignment mark 50 may be formed by using a process like etching, electroplating, or the like. Certainly, the alignment mark 50 may alternatively be formed in another manner.

In addition, as shown in FIG. 23, the alignment mark 50 may be disposed based on the shape of the micromirror chip 10. For example, when the micromirror chip 10 is of the rectangular structure, one alignment mark 50 may be disposed at each of the four corners of the micromirror chip 10 corresponding to the first substrate 201. The alignment mark 50 may be an L-shaped alignment mark shown in FIG. 23. For another example, when the micromirror chip 10 is of the circular structure, at least two alignment marks 50 that are spaced may be disposed in a circumferential direction of the micromirror chip 10 corresponding to the first substrate 201.

Figure 24:
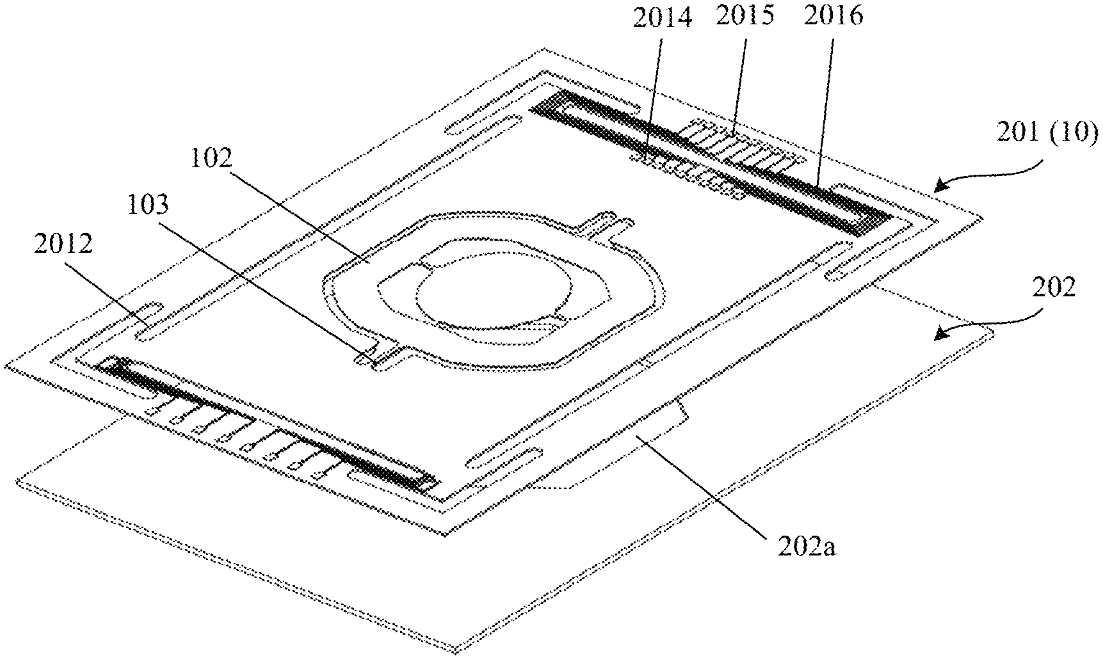
FIG. 24 is an exploded view of a micromirror chip package structure according to an embodiment of this application.

In FIG. 23, the micromirror chip 10 and the first substrate 201 are the two structural components independent of each other. In addition, as shown in FIG. 24, this application further provides another micromirror chip package structure. In FIG. 24, the micromirror chip 10 and the first substrate 201 are of an integrally formed structure. The micromirror chip 10 and the first substrate 201 that are integrated are stacked with the second substrate 202.

That the micromirror chip 10 and the first substrate 201 are of the integrally formed structure may be understood as that the movable component 102 and the first torsion arm 103 may be formed on the first substrate 201 by using the etching process, and the elastic beam 2012 may be etched on the first substrate 201. Such a design may be compatible with an MEMS micromirror process, thereby reducing a thickness of the entire micromirror chip package structure, and further reducing manufacturing costs of the micromirror chip package structure.

Because the micromirror chip 10 and the first substrate 201 are of the integrally formed structure, as shown in FIG. 24, the wire-bonding process may not be required. In this way, the support hole 202*b* does not need to be disposed on the second substrate 202. Instead, the second electrode 2014 in FIG. 24 is electrically connected to the micromirror chip (for example, electrically connected to the drive coil), and the second electrode 2014 is electrically connected to the third electrode 2015 through the first metal cable 2016.

In the foregoing micromirror chip package structures with different structures, the second substrate 202 may be a glass substrate, a ceramic substrate, or a semiconductor substrate (for example, a silicon substrate or a silicon carbide substrate). When the first substrate 201 and the second substrate 202 are of the structures independent of each other, the first substrate 201 may also be a glass substrate, a ceramic substrate, a semiconductor substrate, or the like. When the first substrate 201 and the micromirror chip 10 are of the integrally formed structure, the first substrate 201 may be a semiconductor substrate.

The first substrate 201 and the second substrate 202 may have a substrate structure of a same material, or may use substrate structures of different materials.

Figure 25:
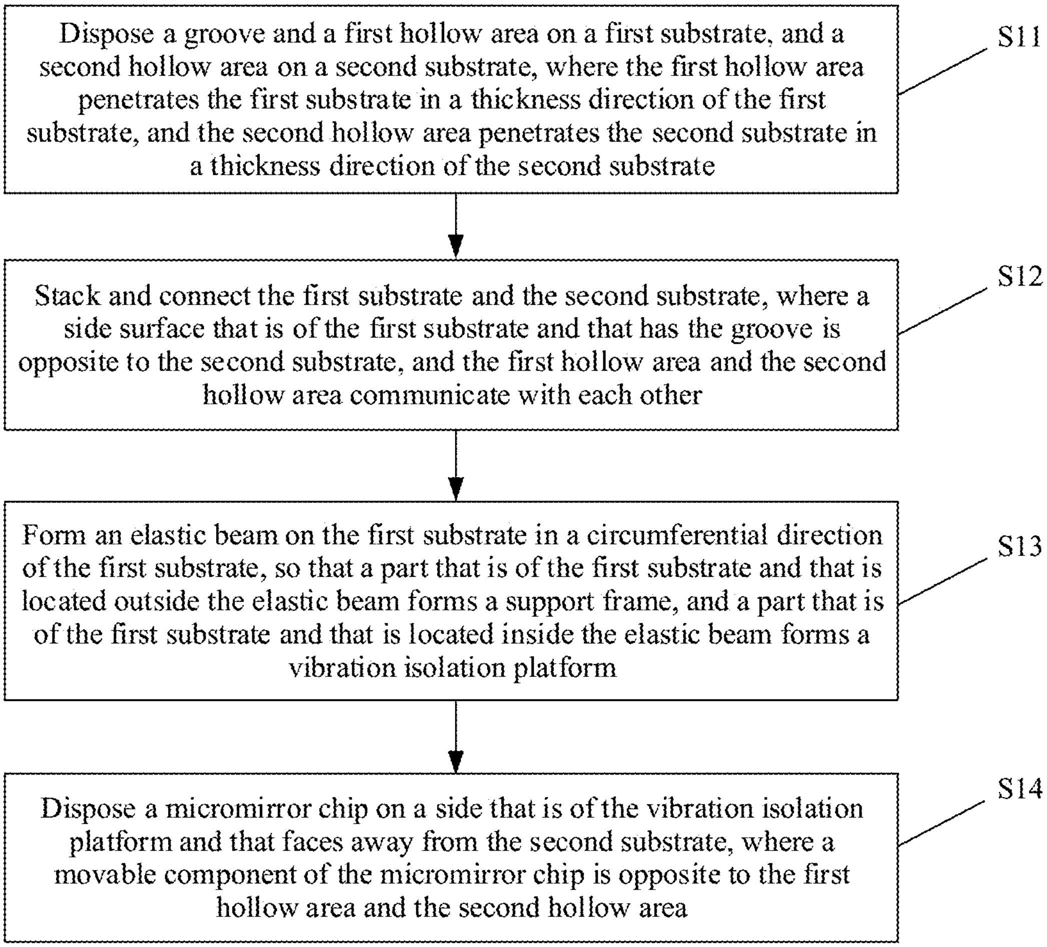
FIG. 25 is a flowchart block diagram of a micromirror chip package structure preparation method according to an embodiment of this application.

This application further provides a micromirror chip package structure preparation method. As shown in FIG. 25, the preparation method mainly includes the following steps:

S11: Dispose a groove and a first hollow area on a first substrate, and a second hollow area on a second substrate, where the first hollow area penetrates the first substrate in a thickness direction of the first substrate, and the second hollow area penetrates the second substrate in a thickness direction of the second substrate.

S12: Stack and connect the first substrate and the second substrate, where a side surface that is of the first substrate and that has the groove is opposite to the second substrate, and the first hollow area and the second hollow area communicate with each other.

S13: Form an elastic beam on the first substrate in a circumferential direction of the first substrate, so that a part that is of the first substrate and that is located outside the elastic beam forms a support frame, and a part that is of the first substrate and that is located inside the elastic beam forms a vibration isolation platform.

S14: Dispose a micromirror chip on a side that is of the vibration isolation platform and that faces away from the second substrate, where a movable component of the micromirror chip is opposite to the first hollow area and the second hollow area.

FIG. 26*a* to FIG. 26*l* are sectional views of process structures obtained after steps are completed in a process for preparing a micromirror chip package structure according to this application.

Figure 26A:
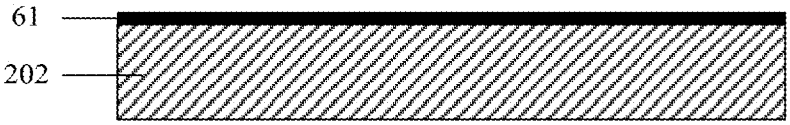
FIG. 26*a* to FIG. 26*l* are diagrams of process structures obtained after corresponding steps in a micromirror chip package structure preparation method are completed according to an embodiment of this application.

As shown in FIG. 26*a*, a photoresist layer 61 is formed on a second substrate 202 of a glass material. The photoresist layer 61 herein may be a metal layer, for example, the photoresist layer 61 made of a gold material.

In some processes, processing such as cleaning and drying may be performed on the second substrate 202 of the glass material during forming of the photoresist layer 61.

Figure 26B:
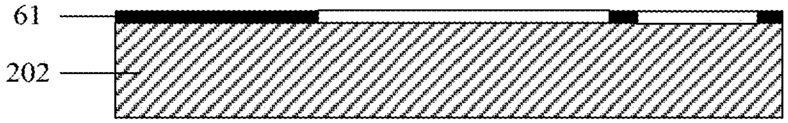

As shown in FIG. 26*b*, exposure development is performed on the photoresist layer 61, and etching is performed on the photoresist layer 61 by using a chemical solution. In other words, patterning is performed on the photoresist layer 61.

Figure 26C:
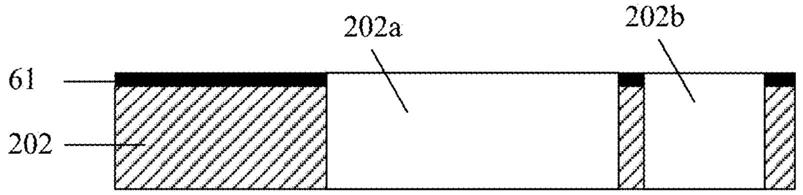

As shown in FIG. 26*c*, the second substrate 202 of the glass material is etched to form a second hollow area 202*a* and a support hole 202*b* that penetrate the second substrate 202.

Figure 26D:
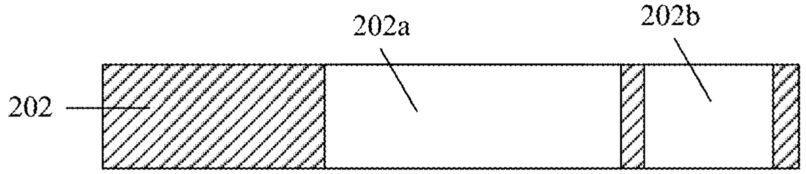

As shown in FIG. 26*d*, the photoresist layer 61 on a surface of the second substrate 202 is removed.

Figure 26E:
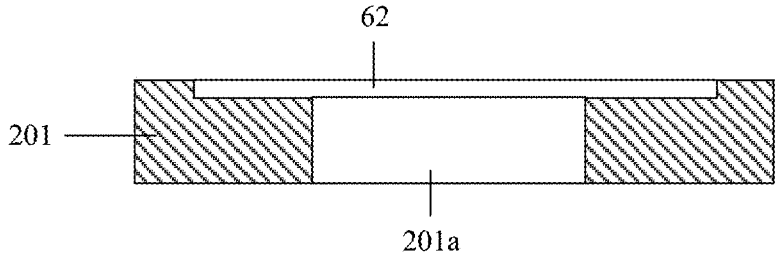

As shown in FIG. 26*e*, a groove 62 and a first hollow area 201*a* are formed on silicon-on-insulator (silicon-on-insulator, SOI) 201, and the first hollow area 201*a* penetrates the silicon-on-insulator 201.

Figure 26F:
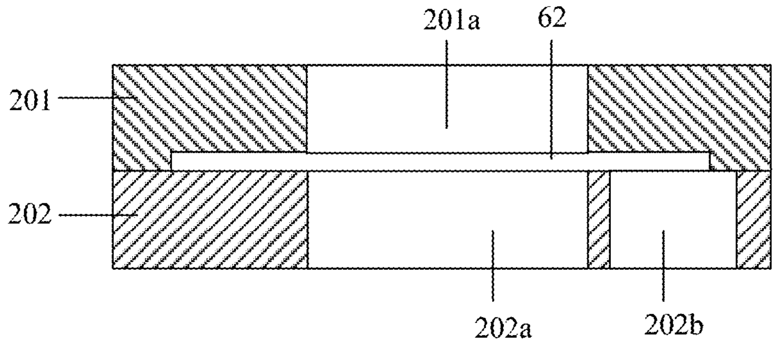

As shown in FIG. 26*f*, a first substrate 201 and the second substrate 202 are bonded, and a surface that is of the first substrate 201 and has the groove 62 is opposite to the second substrate 202, and the first hollow area 201*a* and the second hollow area 202*a* communicate with each other.

Figure 26G:
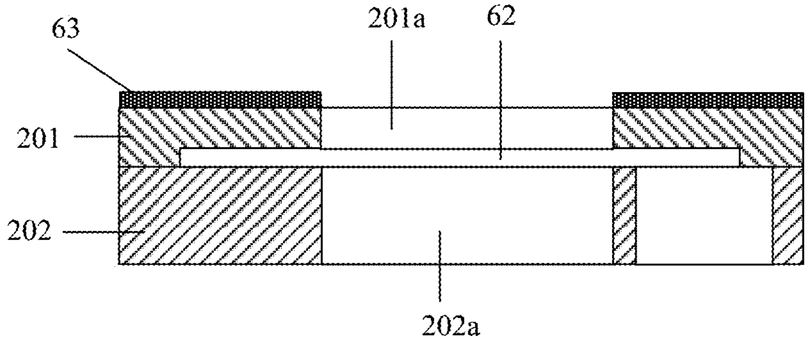

As shown in FIG. 26*g*, thinning processing is performed on the silicon-on-insulator 201, and a metal layer 63 is formed on a surface that is of the thinned silicon-on-insulator 201 and that faces away from the second substrate 202. For example, the metal layer 63 may also be made of the gold material.

Figure 26H:
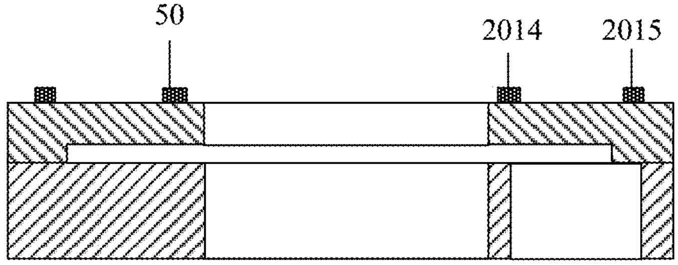

As shown in FIG. 26*h*, exposure development is performed on the metal layer 63, and etching is performed on the metal layer 63 by using a chemical solution, to form an alignment mark 50, a second electrode 2014, and a third electrode 2015.

Figure 26I:
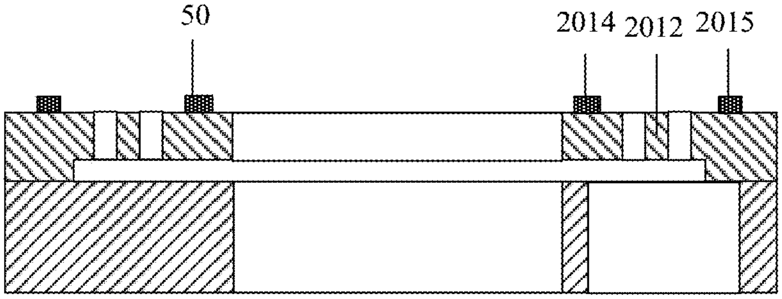

As shown in FIG. 26*i*, an elastic beam 2012 is etched on the second substrate 201.

Figure 26J:
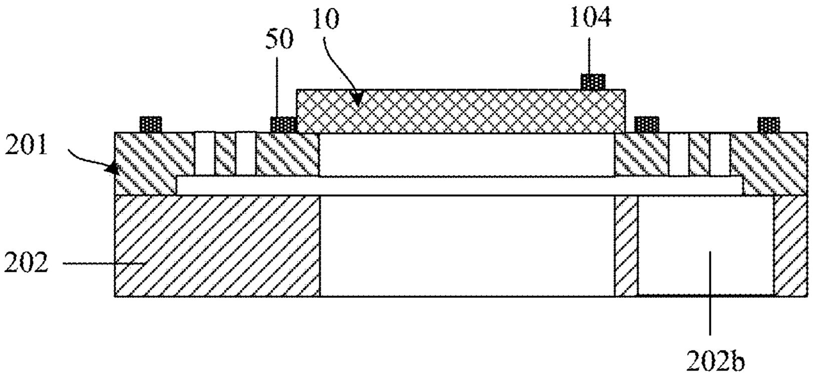

As shown in FIG. 26*j*, a micromirror chip 10 is aligned and mounted on the first substrate 201. In other words, the micromirror chip 10 is disposed on the first substrate 201 by using an adhesive layer.

The micromirror chip 10 shown in FIG. 26*j* includes a movable component 102 and a frame 101, and a first torsion arm 103 connecting the movable component 102 and the frame 101. Further, after mounting of the micromirror chip 10 is completed, the movable component 102 needs to be opposite to the first hollow area 201*a* of the first substrate 201 and the second hollow area 202*a* of the second substrate 202.

Figure 26K:
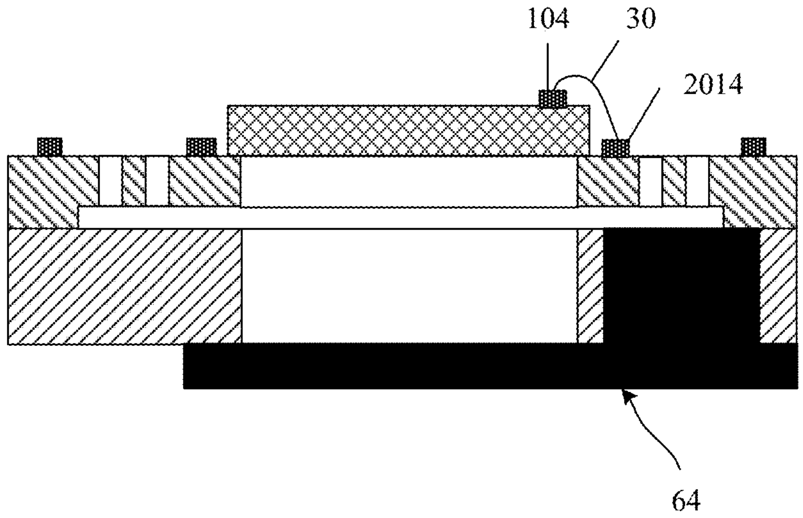

As shown in FIG. 26*k*, a support platform 64 passes through the support hole 202*b* of the second substrate 202, and a lead 30 is electrically connected to a first electrode 104 and the second electrode 2014 of the micromirror chip 10 by using a wire-bonding process.

In this way, the support platform 61 is used, so that a phenomenon that, due to excessive stress in the wire-bonding process, the micromirror chip 10 or the first substrate 201 is warped or even the micromirror chip 10 or the first substrate 201 is damaged can be prevented.

Figure 26L:
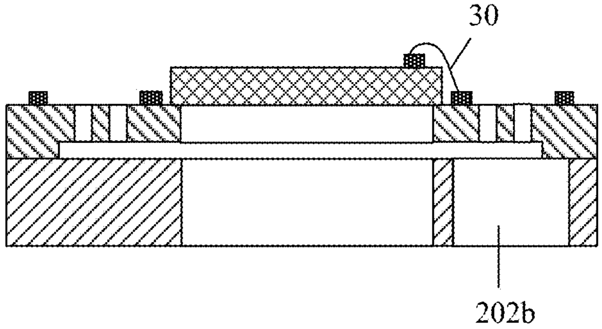

As shown in FIG. 26*l*, the support platform 64 is removed to prepare the micromirror chip package structure.

It should be noted that FIG. 26*a* to FIG. 26*l* may be diagrams of some process structures of the micromirror chip package structure. In some process procedures, based on FIG. 26*a* to FIG. 26*l*, more process procedures may be added, some process procedures may be reduced, or some process procedures may be further refined.

In the descriptions of this specification, the described specific features, structures, materials, or characteristics may be combined in a proper manner in any one or more of embodiments or examples.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A micromirror chip package structure, comprising:
- a micromirror chip; and
- a first substrate and a second substrate that are stacked, wherein the micromirror chip is disposed on a side that is of the first substrate and that faces away from the second substrate, wherein
- the micromirror chip comprises a frame, a movable component, and a first torsion arm, and the movable component is connected to the frame through the first torsion arm;
- the first substrate comprises a vibration isolation platform, an elastic beam, and a support frame, the micromirror chip is disposed on the vibration isolation platform, and the vibration isolation platform is connected to the support frame through the elastic beam;
- the support frame is fastened to the second substrate, and a gap is formed between the vibration isolation platform and the second substrate; and
- the vibration isolation platform and the second substrate each have a hollow area, and the hollow area is opposite to the movable component to accommodate the movable component.

2. The micromirror chip package structure according to claim 1, wherein the gap is filled with a damping medium.

3. The micromirror chip package structure according to claim 2, wherein the damping medium comprises at least one of a liquid damping medium or a solid damping medium.

4. The micromirror chip package structure according to claim 1, wherein a groove is formed on surfaces that are of the vibration isolation platform and the elastic beam and that face the second substrate, and the groove forms the gap.

5. The micromirror chip package structure according to claim 1, wherein a first electrode exists on a surface that is of the frame and that faces away from the first substrate, a second electrode exists on a surface that is of the vibration isolation platform and that faces the micromirror chip, and the first electrode and the second electrode are electrically connected through a lead.

6. The micromirror chip package structure according to claim 5, wherein a third electrode exists on a surface that is of the support frame and that faces the micromirror chip, a first metal cable is further formed on the first substrate, the first metal cable is arranged along the elastic beam, and the second electrode and the third electrode are electrically connected through the first metal cable.

7. The micromirror chip package structure according to claim 1, wherein a sensor is disposed on the elastic beam, and the sensor is configured to detect a deformation amount of the elastic beam; and
- a fourth electrode exists on a surface that is of the first substrate and that faces the micromirror chip, a second metal cable is further formed on the first substrate, and the sensor and the fourth electrode are electrically connected through the second metal cable.

8. The micromirror chip package structure according to claim 1, wherein the micromirror chip and the first substrate are of structures independent of each other, and the micromirror chip is disposed on the vibration isolation platform by using a connection structure.

9. The micromirror chip package structure according to claim 8, wherein a first electrode exists on a surface that is of the frame and that faces away from the first substrate, a second electrode exists on the surface that is of the vibration isolation platform and that faces the micromirror chip, and the first electrode and the second electrode are connected through a lead; and a support hole is disposed in a position that is of the second substrate and that is opposite to the lead, the support hole passes through the second substrate in a stacking direction of the first substrate and the second substrate, and the support hole is used for a support platform to pass through, so that the support platform supports parts that are of the frame and the vibration isolation platform and that are used to dispose the lead.

10. The micromirror chip package structure according to claim 8, wherein an alignment mark exists on a surface that is of the vibration isolation platform and that faces the micromirror chip, and the alignment mark is used to position the micromirror chip, so that the micromirror chip is disposed in a central area of the first substrate.

11. The micromirror chip package structure according to claim 1, wherein the micromirror chip and the first substrate are of an integrally formed structure.

12. The micromirror chip package structure according to claim 1, wherein the support frame is connected to the second substrate by using a bonding structure.

13. The micromirror chip package structure according to claim 1, wherein a size of the gap in a stacking direction of the first substrate and the second substrate is 10 μm to 30 μm.

14. The micromirror chip package structure according to claim 1, wherein the first substrate comprises a glass substrate, a ceramic substrate, or a semiconductor substrate; and the second substrate comprises a glass substrate, a ceramic substrate, or a semiconductor substrate.

15. The micromirror chip package structure according to claim 1, wherein the movable component comprises a micromirror and a drive coil, the micromirror is connected to the drive coil through a second torsion arm, and the drive coil is connected to the frame through the first torsion arm; and the first torsion arm and the second torsion arm are perpendicular to each other, and are separately perpendicular to a stacking direction of the first substrate and the second substrate.

16. A laser device, comprising:

a micromirror chip package structure, and a circuit board, wherein the micromirror chip package structure is electrically connected to the circuit board; wherein the micromirror chip package structure comprises a micromirror chip; and a first substrate and a second substrate that are stacked, wherein the micromirror chip is disposed on a side that is of the first substrate and that faces away from the second substrate, wherein the micromirror chip comprises a frame, a movable component, and a first torsion arm, and the movable component is connected to the frame through the first torsion arm;

the first substrate comprises a vibration isolation platform, an elastic beam, and a support frame, the micromirror chip is disposed on the vibration isolation platform, and the vibration isolation platform is connected to the support frame through the elastic beam;

the support frame is fastened to the second substrate, and a gap is formed between the vibration isolation platform and the second substrate; and the vibration isolation platform and the second substrate each have a hollow area, and the hollow area is opposite to the movable component to accommodate the movable component.

17. The laser device according to claim 16, wherein the gap is filled with a damping medium.

18. The laser device according to claim 17, wherein the damping medium comprises at least one of a liquid damping medium or a solid damping medium.

19. The laser device according to claim 16, wherein a groove is formed on surfaces that are of the vibration isolation platform and the elastic beam and that face the second substrate, and the groove forms the gap.

20. A vehicle, comprising:

a laser device, and a vehicle body, wherein the laser device is disposed on the vehicle body;

wherein the laser device comprises a micromirror chip package structure, and a circuit board, wherein the micromirror chip package structure is electrically connected to the circuit board; wherein the micromirror chip package structure comprises a micromirror chip; and a first substrate and a second substrate that are stacked, wherein the micromirror chip is disposed on a side that is of the first substrate and that faces away from the second substrate, wherein the micromirror chip comprises a frame, a movable component, and a first torsion arm, and the movable component is connected to the frame through the first torsion arm;

the first substrate comprises a vibration isolation platform, an elastic beam, and a support frame, the micromirror chip is disposed on the vibration isolation platform, and the vibration isolation platform is connected to the support frame through the elastic beam;

the support frame is fastened to the second substrate, and a gap is formed between the vibration isolation platform and the second substrate; and the vibration isolation platform and the second substrate each have a hollow area, and the hollow area is opposite to the movable component to accommodate the movable component.

* * * * *